(12) United States Patent
Song

(10) Patent No.: US 8,624,216 B2
(45) Date of Patent: Jan. 7, 2014

(54) PLANAR ELECTRONIC SEMICONDUCTOR DEVICE

(75) Inventor: Aimin Song, Stockport (GB)

(73) Assignee: Pragmatic Printing Limited (GB)

( * ) Notice: Subject to any disclaimer, the term of this patent is extended or adjusted under 35 U.S.C. 154(b) by 751 days.

(21) Appl. No.: 11/920,080

(22) PCT Filed: May 9, 2006

(86) PCT No.: PCT/GB2006/001667
§ 371 (c)(1),
(2), (4) Date: Apr. 27, 2009

(87) PCT Pub. No.: WO2006/120414
PCT Pub. Date: Nov. 16, 2006

(65) Prior Publication Data
US 2009/0315017 A1    Dec. 24, 2009

(30) Foreign Application Priority Data

May 9, 2005  (GB) .................................. 0509410.7
May 9, 2005  (GB) .................................. 0509411.5

(51) Int. Cl.
*H01L 47/00* (2006.01)

(52) U.S. Cl.
USPC .............. 257/4; 257/24; 257/314; 257/E21.4; 438/99; 438/142; 438/149; 438/159

(58) Field of Classification Search
USPC ........ 257/24, E29.168, 314–316, 401, E21.4; 438/142, 99, 149, 159, 161, 163, 669; 977/936
See application file for complete search history.

(56) References Cited

U.S. PATENT DOCUMENTS

| 5,385,865 | A | 1/1995 | Nieder et al. |
| 6,838,698 | B1 * | 1/2005 | Yamazaki et al. ............... 257/66 |

(Continued)

FOREIGN PATENT DOCUMENTS

| EP | 0464831 A2 | 1/1992 |
| EP | 1422766 A2 | 5/2004 |

(Continued)

OTHER PUBLICATIONS

International Search Report, PCT/GB2006/001667, dated Feb. 20, 2007.

(Continued)

*Primary Examiner* — Mark A Laurenzi
(74) *Attorney, Agent, or Firm* — Lerner, David, Littenberg, Krumholz & Mentlik, LLP

(57) ABSTRACT

An electronic device includes a substrate supporting mobile charge carriers, insulative features formed on the substrate surface to define first and second substrate areas on either side of the insulative features, the first and second substrate areas being connected by an elongate channel defined by the insulative features, the channel providing a charge carrier flow path in the substrate from the first area to the second area, the conductivity between the first and second substrate areas being dependent upon the potential difference between the areas. The mobile charge carriers can be within at least two modes in each of the three dimensions within the substrate. The substrate can be an organic material. The mobile charge carriers can have a mobility within the range 0.01 $cm^2$/Vs to 100 $cm^2$/Vs, and the electronic device may be an RF device. Methods for forming such devices are also described.

16 Claims, 25 Drawing Sheets

(56) References Cited

U.S. PATENT DOCUMENTS

| | | | |
|---|---|---|---|
| 7,736,728 B2 * | 6/2010 | Loboda et al. | 428/218 |
| 2004/0149679 A1 | 8/2004 | Song et al. | |
| 2006/0006454 A1 * | 1/2006 | Wang | 257/314 |
| 2006/0170067 A1 * | 8/2006 | Maekawa et al. | 257/401 |
| 2009/0066610 A1 * | 3/2009 | Sakamoto et al. | 345/60 |
| 2009/0108992 A1 * | 4/2009 | Shafer | 340/10.1 |

FOREIGN PATENT DOCUMENTS

| | | | | |
|---|---|---|---|---|
| EP | 1508924 A2 | 2/2005 | | |
| JP | 2003317950 A | 11/2003 | | |
| WO | PCT/GB02/01807 | * | 4/2002 | H01L 27/00 |
| WO | 02/086973 A2 | 10/2002 | | |
| WO | 03050854 A2 | 6/2003 | | |
| WO | 2005004194 A2 | 1/2005 | | |
| WO | 2006/008467 A1 | 1/2006 | | |

OTHER PUBLICATIONS

Song A M et al.: Applied Physics Letters, AIP, American Institute of Physics, Melville. NY, US, 83(9); 1881-1883 (2003), XP012035982.

Yagi Iwao et al: Applied Physics Letters, AIP, American Insiitute of Physics, Melville, NY, US, 8(5); 813-815 (2004), XP012062006.

Assadi A, Svensson C., Willander M.,Inganas 0.: Journal of Applied Physics, 72(7); 2900-2906 (1992), XP002416770.

Yagi et al., "Direct observation of contact and channel resistance in pentacene four-terminal thin-film transistor patterned by laser ablation method", Applied Physics Letters, vol. 84, No. 5, pp. 813-815, Feb. 2004; doi: 10.1063/1.1645316.

Partial European Search Report for Application No. EP 10183783 dated Jul. 24, 2013.

* cited by examiner

PLANAR ELECTRONIC SEMICONDUCTOR DEVICE

CROSS REFERENCE TO RELATED APPLICATIONS

The present application is a national phase entry under 35 U.S.C. §371 of International Application No. PCT/GB2006/001667, filed May 9, 2006, published in English, which claims benefit of United Kingdom Patent Application No. 0509410.7, filed May 9, 2005 and United Kingdom Patent Application No. 0509411.5, filed May 9, 2005. The disclosures of all of said applications are incorporated by reference herein.

The present invention relates to electronic devices, including planar electronic devices, to uses of such electronic devices, and to manufacturing methods of such electronic devices. The present invention is particularly suitable for, but not limited to, nanoelectronic devices.

EP 0,464,831 describes a transistor device utilising a 2D (two-dimensional) charge carrier layer such as a 2DEG (two-dimensional electron gas). In order to form the 2DEG, the 2D charge carrier layer has to have a thickness less than the charge carrier wavelength (i.e. electron wavelength), such that the charge carrier is confined to movement within the two dimensions of the layer. The transistor is formed by building lateral potential barriers in the 2D-charge carrier layer.

WO 02/086973 describes how diode devices (e.g. self-switching diodes) can be formed. WO 06/008467 describes how such SSDs can be utilised as memory units, based upon the unexpected affect that the voltage-current characteristics of the SSDs have a degree of hysteresis. FIG. 1A shows a semiconductor layer structure that can be utilised to form such an SSD.

FIG. 1A illustrates a wafer 120'. The wafer 120' is a modulation-doped $In_{0.75}Ga_{0.25}As/InP$ quantum-well wafer. The wafer 120' utilised to form the substrate 120 of the SSD/memory unit 110 can be envisaged as being formed of at least four discrete layers 120a, 120b, 120c, 120d. The two layers 120a, 120b are formed of undoped in P, the layers being separated by impurities (i.e. dopants).

The third layer 120c is formed of undoped Gas. Typically, this third layer is approximately 9 nm thick (i.e. less than the electron wavelength). The third layer provides the quantum well for the two-dimensional electron gas.

The fourth layer is another layer of undoped InP. Thus, the layer utilised to form the quantum-well is sandwiched between two layers (120b, 120d) of another semiconductor. The upper two layers 120a, 120b define the depth of the quantum well beneath the surface of the substrate of the memory unit. Typically, each of the other layers 120a, 120b is 20 nm thick i.e. the quantum well containing the two-dimensional electron gas is formed approximately 40 nm beneath the substrate surface.

FIGS. 1B and 1C show respectively a plan view, and a cross-sectional view along the line CC in FIG. 1B, of an SSD 120.

Once the wafer 120' is formed, insulative features (e.g. insulating hooves) 130, 132, 134 are then formed on the surface, to provide the device functionality. The grooves 130, 132, 134 can be formed using nanolithography. The grooves 130, 132, 134 are etched through the two-dimensional electron gas layer 142.

The grooves act to separate the upper surface of the substrate 120 into two areas 122, 124. The two areas 122, 124 are connected by a channel 140 extending between, and defined by, the grooves 132, 134. The grooves 130 extend to the edges of the upper surface of the memory unit 120, so as to separate the upper surface into two discrete areas 122, 124, with the channel 140 providing the current flow path between the two surface areas 122, 124.

The channel 140 is of width Wc and length Lc. The grooves or trenches are of width Wt, and extend to a depth of $D_t$ beneath the surface of the substrate. The two-dimensional electron gas is a depth $D_g$ beneath the surface of the substrate. $D_t$ is greater than $D_g$. Typical dimensions are: $D_g$ is between 30 nm and 50 nm. The 2DEG is between 5 nm and 10 nm thick (i.e. less than the electron wavelength). The channel width Wc is between 10 nm and 50 nm. The groove width Wt is between 10 nm and 300 nm. The channel length Lc is 3 to 4 times the channel width Wt i.e. Lc is between 30 nm and 1.2 μm.

The conductivity of the channel is dependent upon the potential difference between the areas 122,124 (i.e. the device functions as a diode). The change in conductivity is due to alteration/control of the lateral depletion regions of the charge carrier within the channel.

A transistor can be realised by providing an additional groove, so as to define a third area adjacent the channel 140. Applying an appropriate voltage to that area can also alter the lateral depletion regions adjacent to the channel sidewalls, thus also altering the channel conductance.

It is an aim of embodiments of the present invention to provide improved planar electronic devices. It is an aim of particular embodiments to provide planar electronic devices that are easier to manufacture, and methods of manufacturing such devices.

In a first aspect, the present invention provides an electronic device comprising a substrate supporting mobile charge carriers, insulative features formed on the substrate surface to define first and second substrate areas on either side of the insulative features, the first and second substrate areas being connected by an elongate channel defined by the insulative features, the channel providing a charge carrier flow path in the substrate from the first area to the second area, the conductivity between the first and second substrate areas being dependent upon the potential difference between the areas, wherein the mobile charge carriers can be within at least two modes in each of the three dimensions within the substrate.

The substrate layer containing the mobile charge carriers may have a thickness greater than the charge carrier wavelength.

The present inventor has realised that such electronic devices do not require a two-dimensional electron gas to function, despite the general teachings of the prior art. Consequently, the layer containing the mobile charge carriers (e.g. holes or electrons) does not need to be formed to constrain movement of the charge carriers to share a single, well-defined localised mode e.g. have a thickness less than the charge carrier wavelength. As a quantum well does not need to be formed for the relevant two-dimensional charge carrier (e.g. electron gas), this allows the use of alternative materials of manufacture and less expensive manufacturing methods.

In a second aspect, the present invention provides an electronic device comprising a substrate supporting mobile charge carriers, insulative features formed on the substrate surface to define first and second substrate areas on either side of the insulative features, the first and second substrate areas being connected by an elongate channel defined by the insulative features, the channel providing a charge carrier flow path in the substrate from the first area to the second area, the conductivity between the first and second substrate areas being dependent upon the potential difference between the areas, wherein the substrate comprises an organic material.

Previously, it had generally been believed that such devices needed to be formed from inorganic semiconductor materials, to provide the relevant lateral depletion regions close to the channel sidewalls. Organic materials were believed to be unsuitable for forming planar electronic devices, as no obvious depletion regions have been reported in organic materials so far. However, experiments by the present inventor have proven that depletion regions are not required, and that organic materials can be successfully utilised to form such electronic devices. Organic electronic devices can be manufactured at a lower cost, and can be provided with simpler packaging, compared to conventional inorganic electronics, as well as being compatible with flexible circuits.

In a third aspect, the present invention provides an electronic device comprising a substrate supporting mobile charge carriers, insulative features formed on the substrate surface to define first and second substrate areas on either side of the insulative features, the first and second substrate areas being connected by an elongate channel defined by the insulative features, the channel providing a charge carrier flow path in the substrate from the first area to the second area, the conductivity between the first and second substrate areas being dependent upon the potential difference between the areas, wherein the mobile charge carriers have a mobility within the range 0.01 cm$^2$/Vs to 100 cm$^2$/Vs.

Previously, it had generally been believed that such devices needed to be formed from high-electron mobility materials. Whilst that is believed to be true for many electronic devices, including nanodevices, the present inventor has realised that electronic devices having the above structure as indicated above (e.g. planar devices, including planar nanotransistors) do not require high-electron mobility materials to function.

The mobile charge carriers may have a mobility of at least 0.1 cm$^2$/Vs.

Said elongate channel may be of predetermined width such that when a voltage difference is applied between said first and second substrate areas such as to cause flow of said mobile charge carriers through said elongate channel, the voltage existing in the second substrate area influences, via said insulative features, the size of depletion regions existing within said elongate channel, whereby the conductivity characteristics of the channel are dependent on said voltage difference.

The device may comprise a diode for rectifying an RF signal. The RF signal may be between 0.5 MHz and 1 GHz. The RF signal may be between 0.5 MHz and 400 MHz.

Said mobile charge carriers may be electrons.

Said mobile charge carriers may be holes.

Said substrate may be greater than 20 nm thick.

The device may function as a diode.

The insulative features may further define a third substrate area adjacent the elongate channel for application of a voltage to control the conductivity of the channel.

The insulative features may further define a fourth substrate area adjacent the elongate channel, on the opposite side of the channel to the third substrate area, for application of a voltage to control the conductivity of the channel.

The device may function as a transistor.

Said device may be a planar device, with said substrate being positioned within a single layer.

Said single layer may be not sandwiched between two additional layers of other material within a laminate structure.

Said single layer may define an outer surface of the device.

Said substrate may be formed as a thin film, disposed on an insulative substrate.

Said substrate may comprise at least one of: semi-conducting polymer, poly(3-hexyl)thiophene (P3HT); organic small molecules; pentacene; solution processed semiconductor nanoparticle/quantum dot materials. Said insulative substrate may comprise at least one of flexible paper; polyethylene terephthalate (PET); and polyethylene naphthalate (PEN) material.

The device may further comprise a respective electrical terminal located on each of said areas for application of a voltage thereto.

An electronic circuit may comprise at least one electronic device as described above.

The electronic circuit may comprise a plurality of said electronic devices arranged in parallel between said first and second substrate areas to provide a desired impedance.

The electronic circuit may comprise an RFID tag.

In a fourth aspect, the present invention provides a method of manufacture of a device as described above, comprising: providing a substrate supporting mobile charge carriers; forming insulative features formed on the substrate surface to define first and second substrate areas on either side of the insulative features, the first and second substrate areas being connected by an elongate channel defined by the insulative features, the channel providing a charge carrier flow path in the substrate from the first area to the second area, the conductivity between the first and second substrate areas being dependent upon the potential difference between the areas, to form a device as described above.

In a fifth aspect, the present invention provides a method of patterning organic films, comprising: (a) providing a substrate and forming on the substrate a layer of photoresist material; (b) forming a desired pattern in the photoresist material by a process of photolithography, (c) forming a layer of organic material on the patterned photoresist material; (d) performing a lift off process to selectively remove the organic material so that the organic material conforms to the patterning of the photoresist material.

The resulting patterned organic material may form a device as described above.

The organic material may comprise polymer material or small molecule material. The polymer material may be P3HT. The small molecule material may be pentacene.

A solvent may be employed for applying P3HT that is non-reactive with the photoresist material. The photoresist material may be xylene.

The solvent employed to perform the lift off process may have a sufficiently weak action to avoid lifting off the entire layer of organic material. The solvent may be diluted acetone.

Said substrate may be silicon having a layer of silica thereon.

The substrate may have source and drain contacts, and the patterned organic material may form a conductive channel therebetween.

The integrity of the patterned organic material may be maintained after lift-off in order that the electrical properties of the material are unaffected.

In a sixth aspect, the present invention provides a method of patterning organic films, comprising: (a) providing a substrate and forming on the substrate a layer of organic material; (b) allowing the organic material to completely dry; (c) forming a layer of photoresist material on the organic material; (d) forming a desired pattern in the photoresist material by a process of photolithography; (e) selectively removing the organic material by etching so that the remaining organic material conforms to the patterning of the photoresist material.

The resulting patterned organic material may form a device as described above.

The organic material may be P3HT.

Embodiments of the present invention will now be described, by way of example only, with reference to the accompanying drawings, in which.

Figure 6:
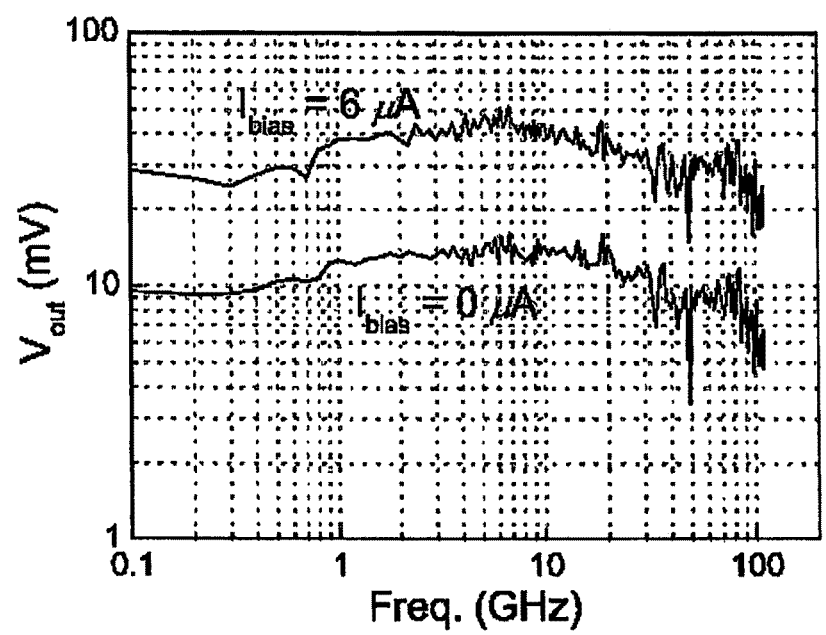
Figure 7:
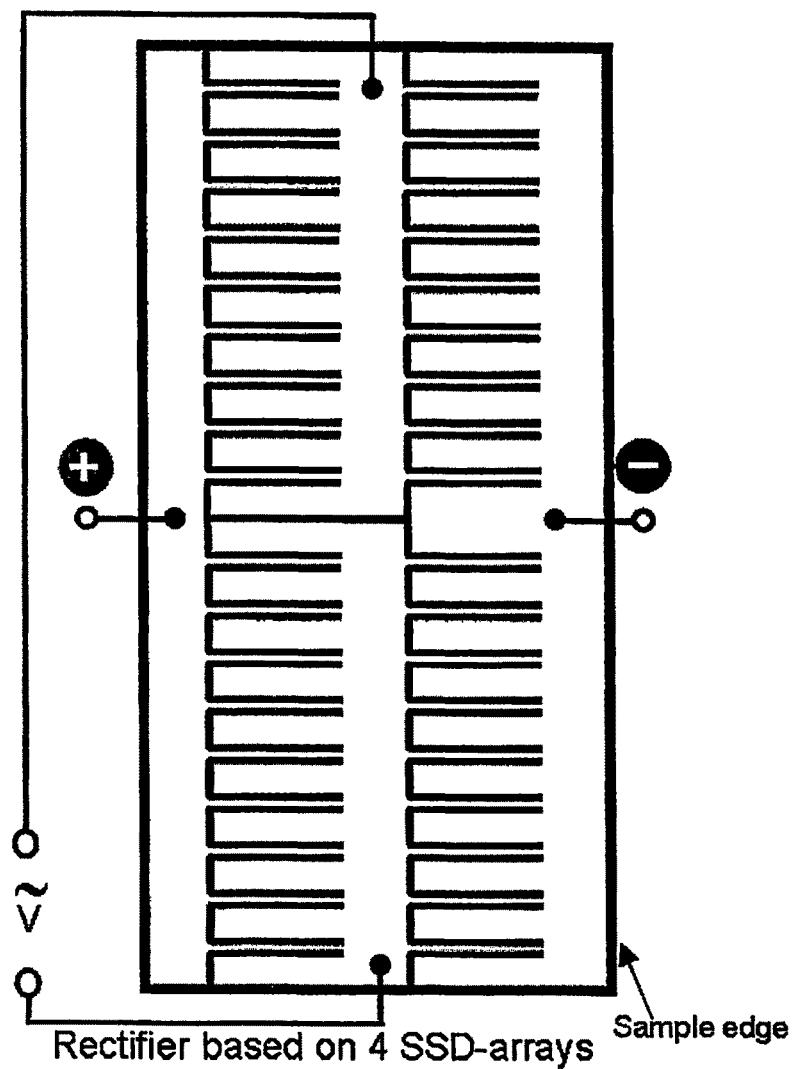
Figure 8:
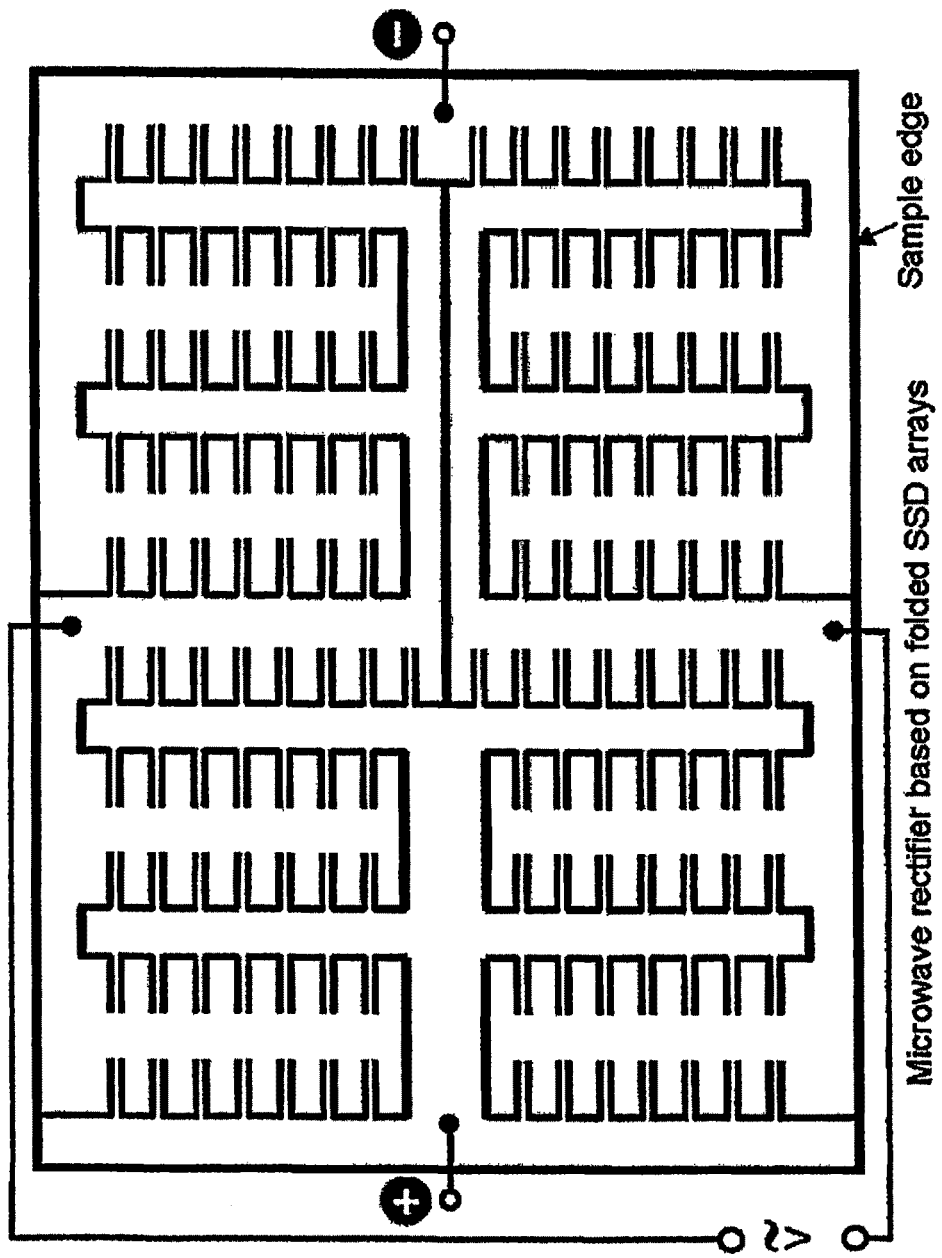
Figure 9A:
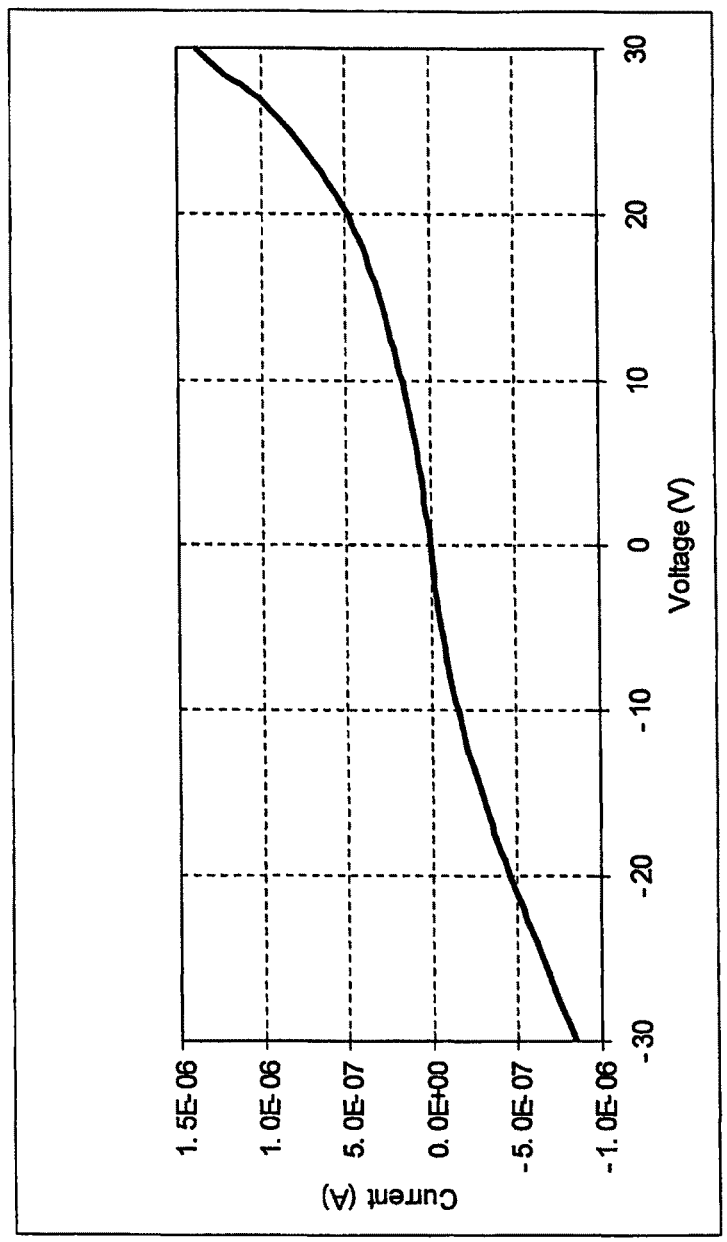
Figure 9B:
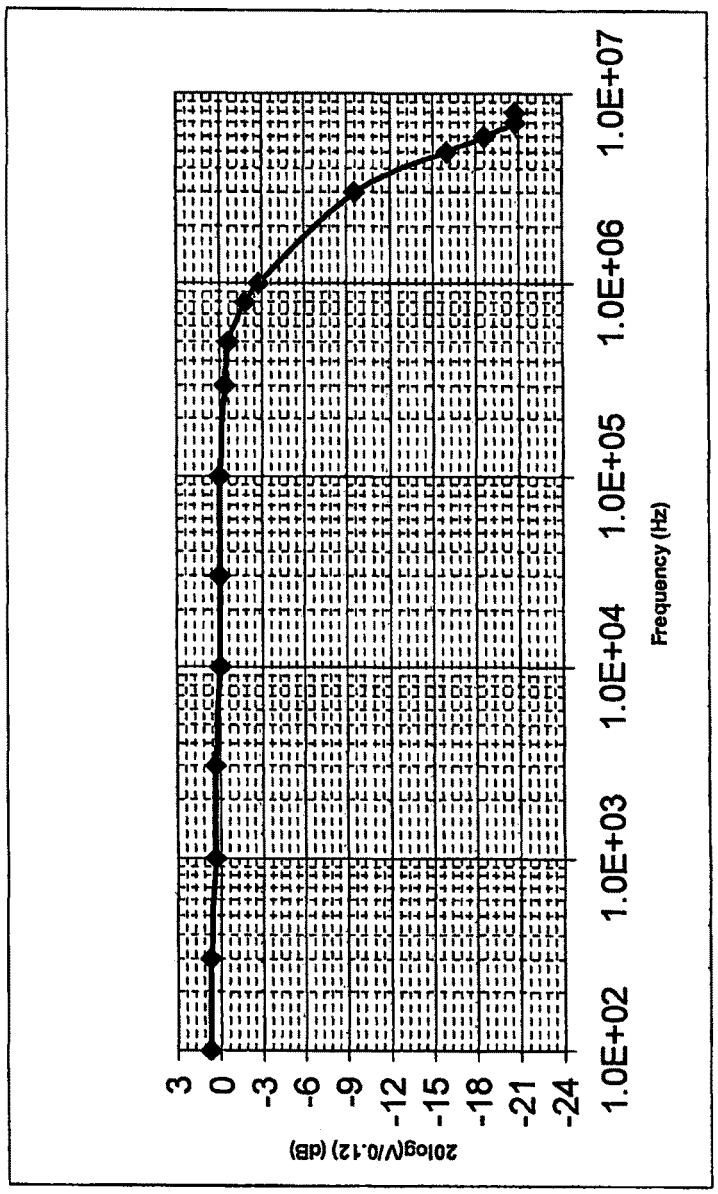
Figure 10A:
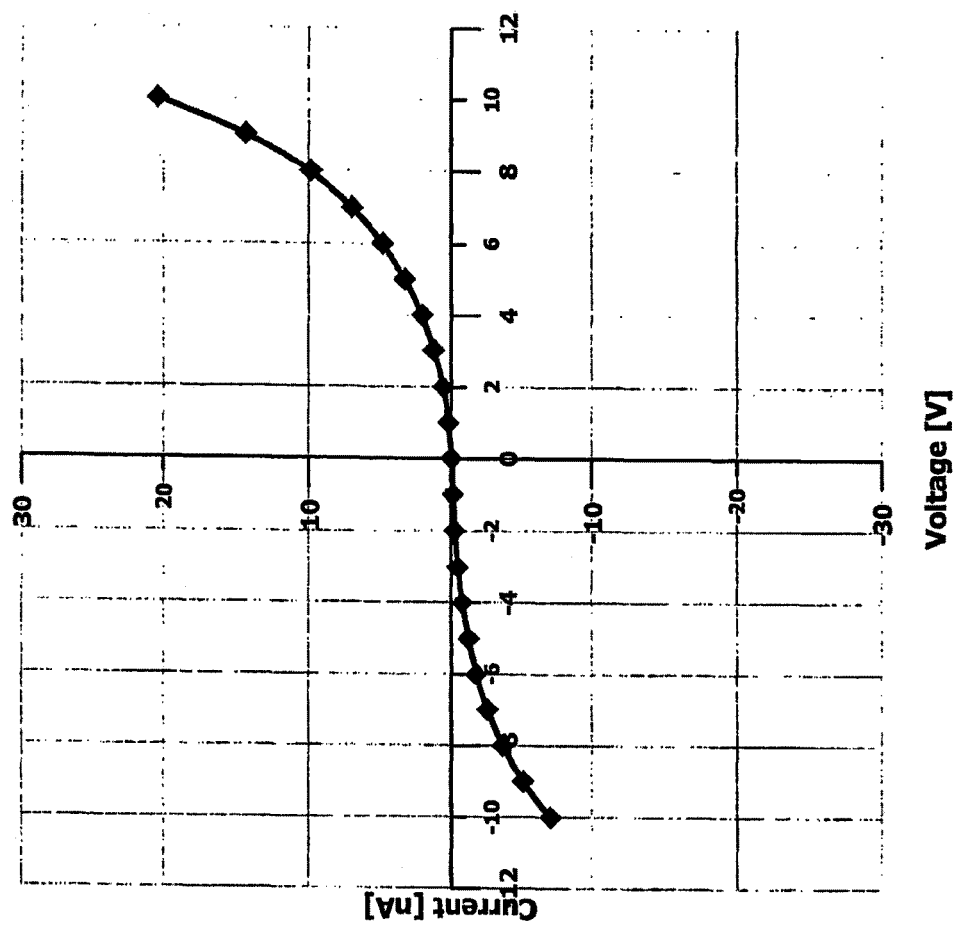
Figure 10B:
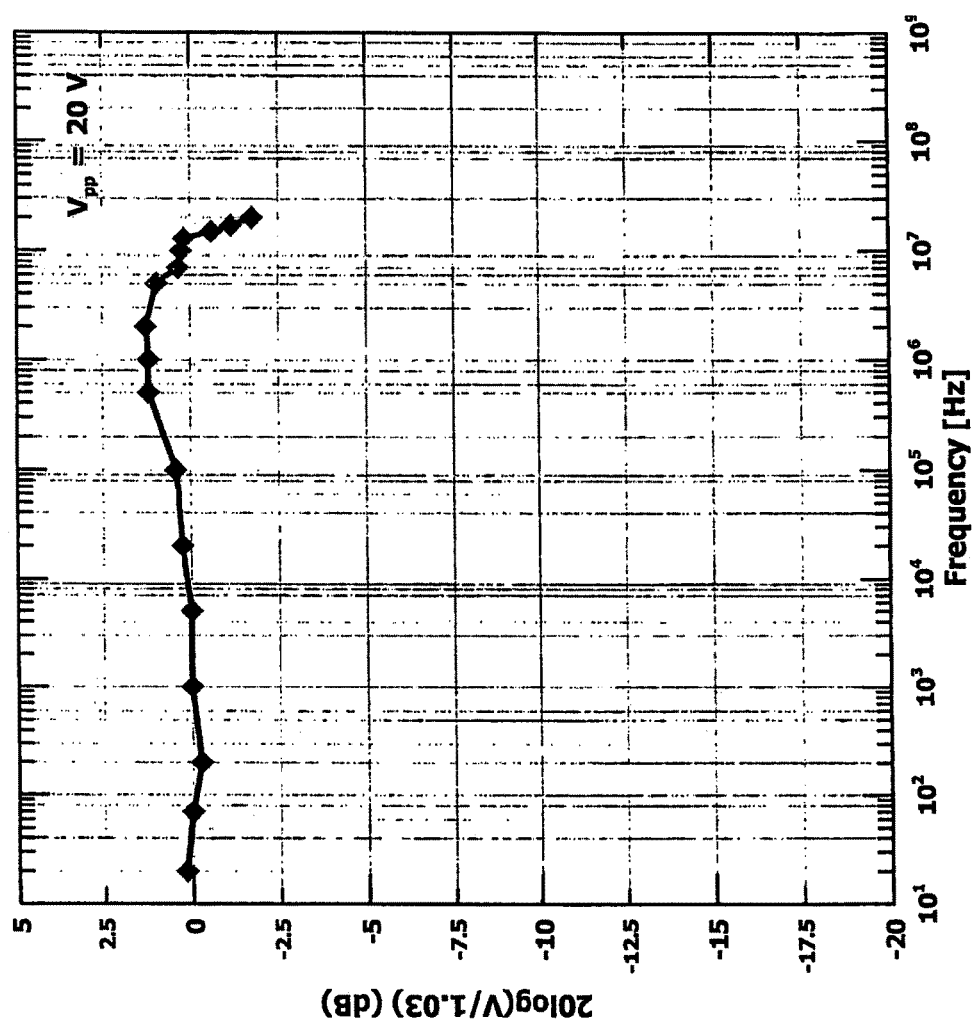
Figure 10C:
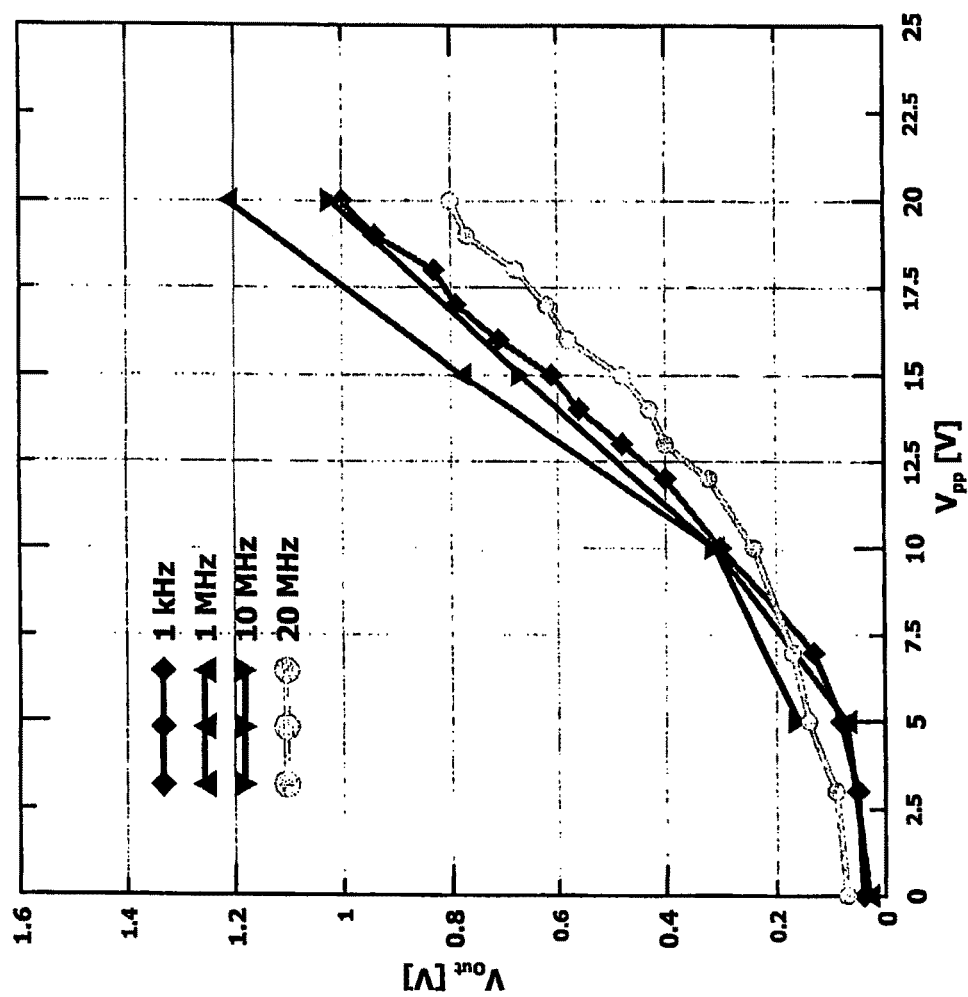
Figure 11:
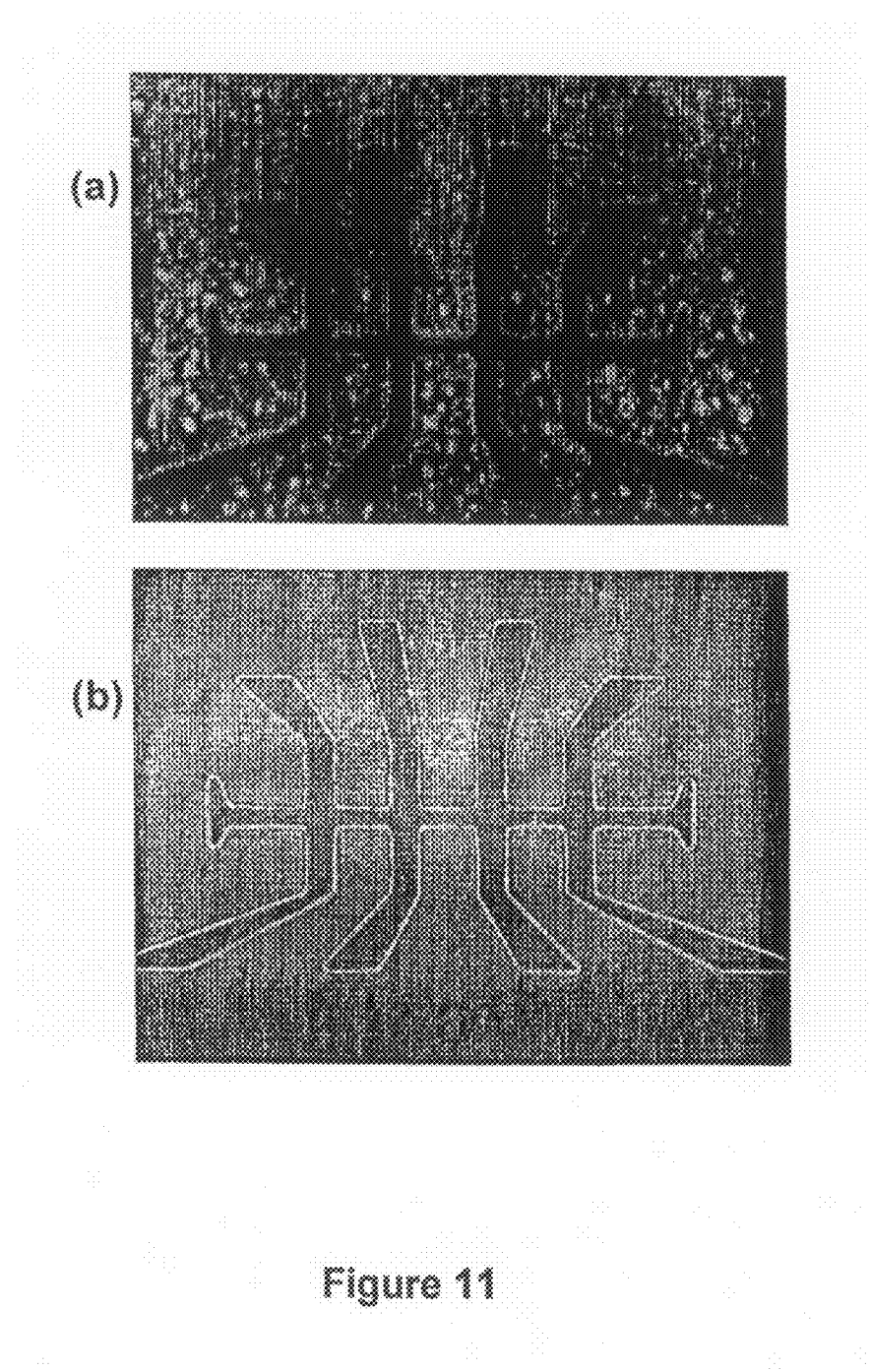
Figure 12:
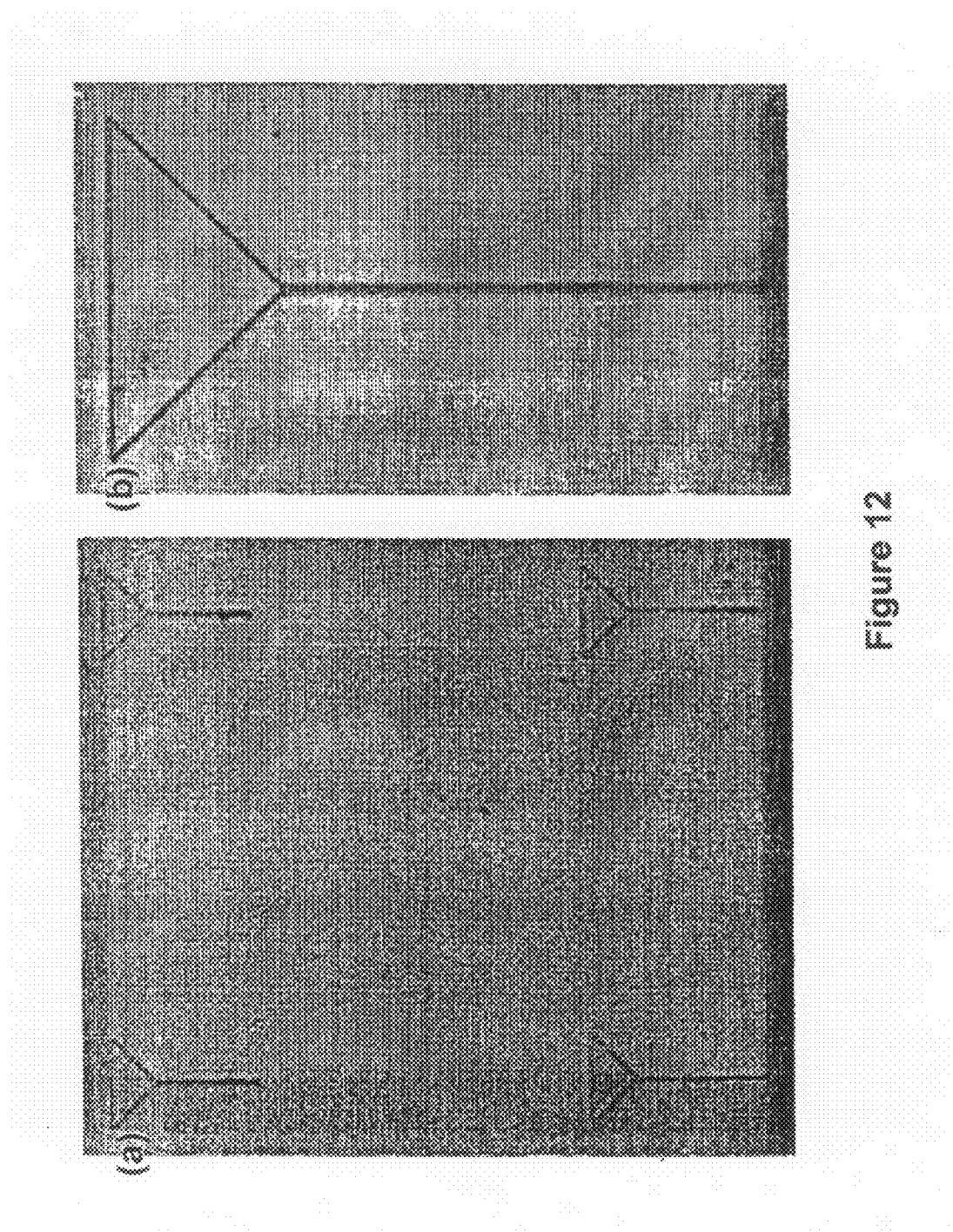
Figure 13:
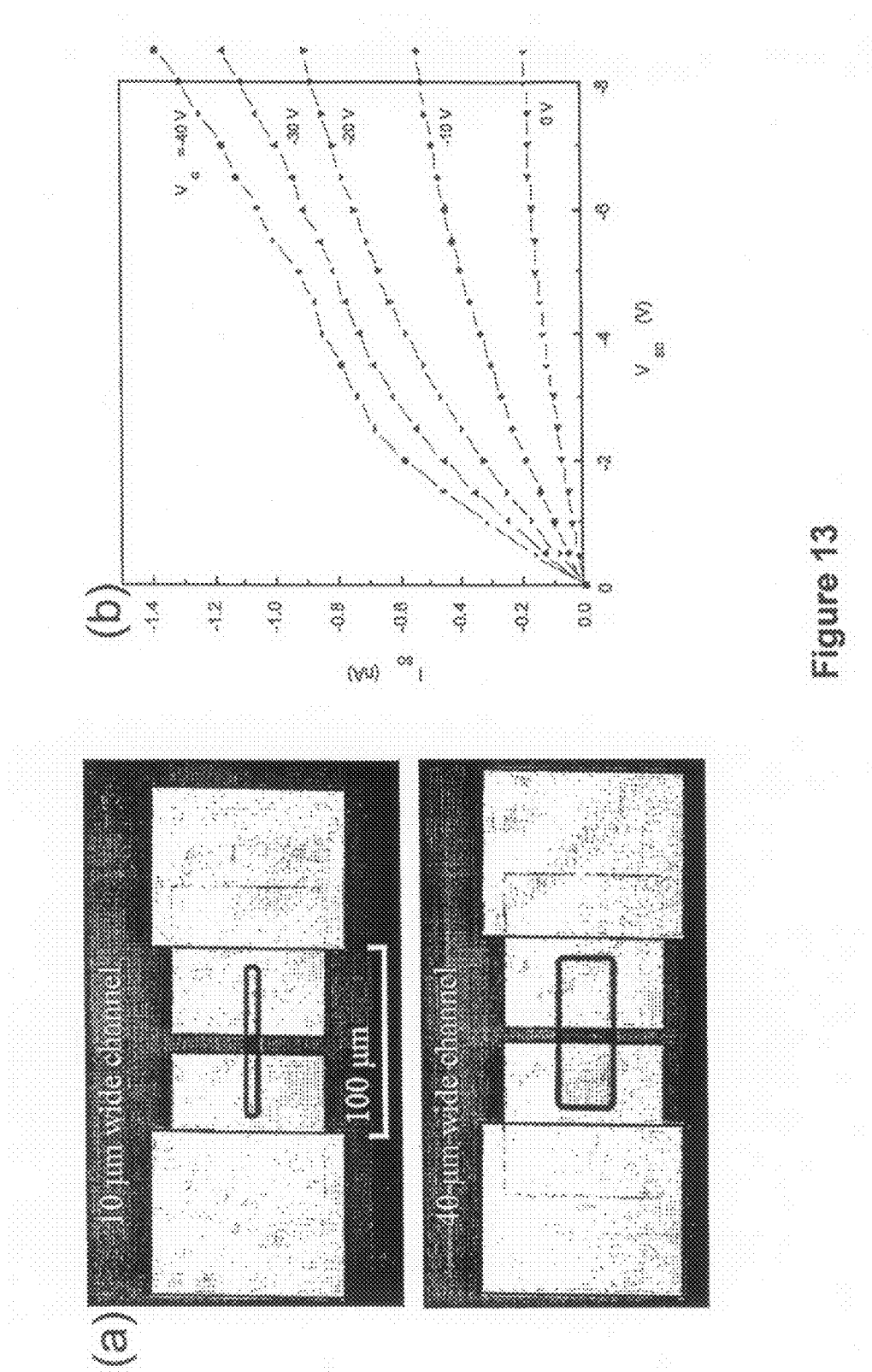
Figure 14:
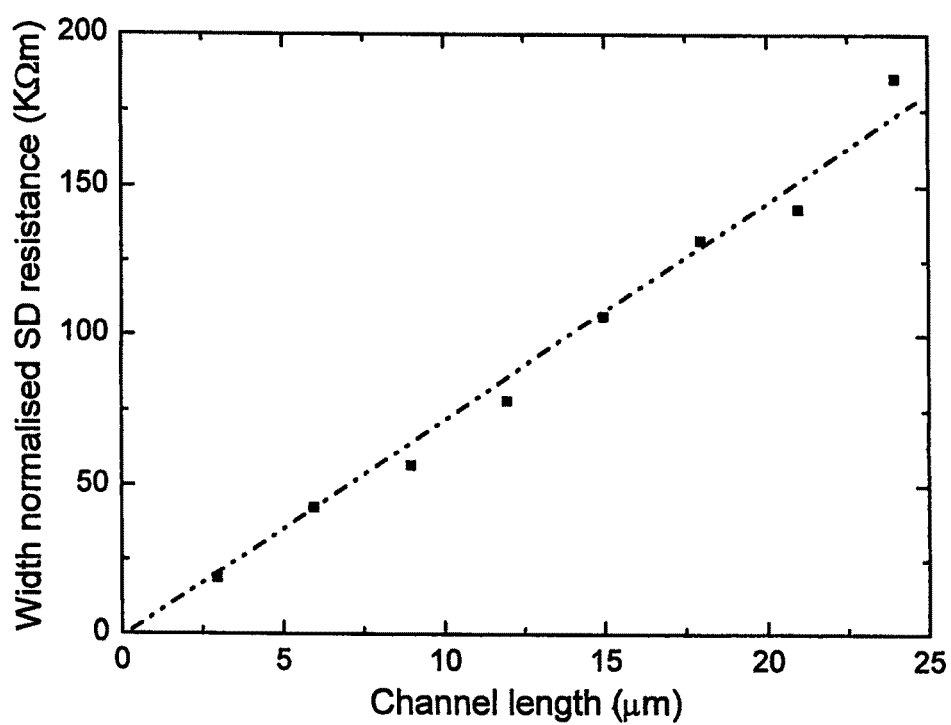
Figure 15:
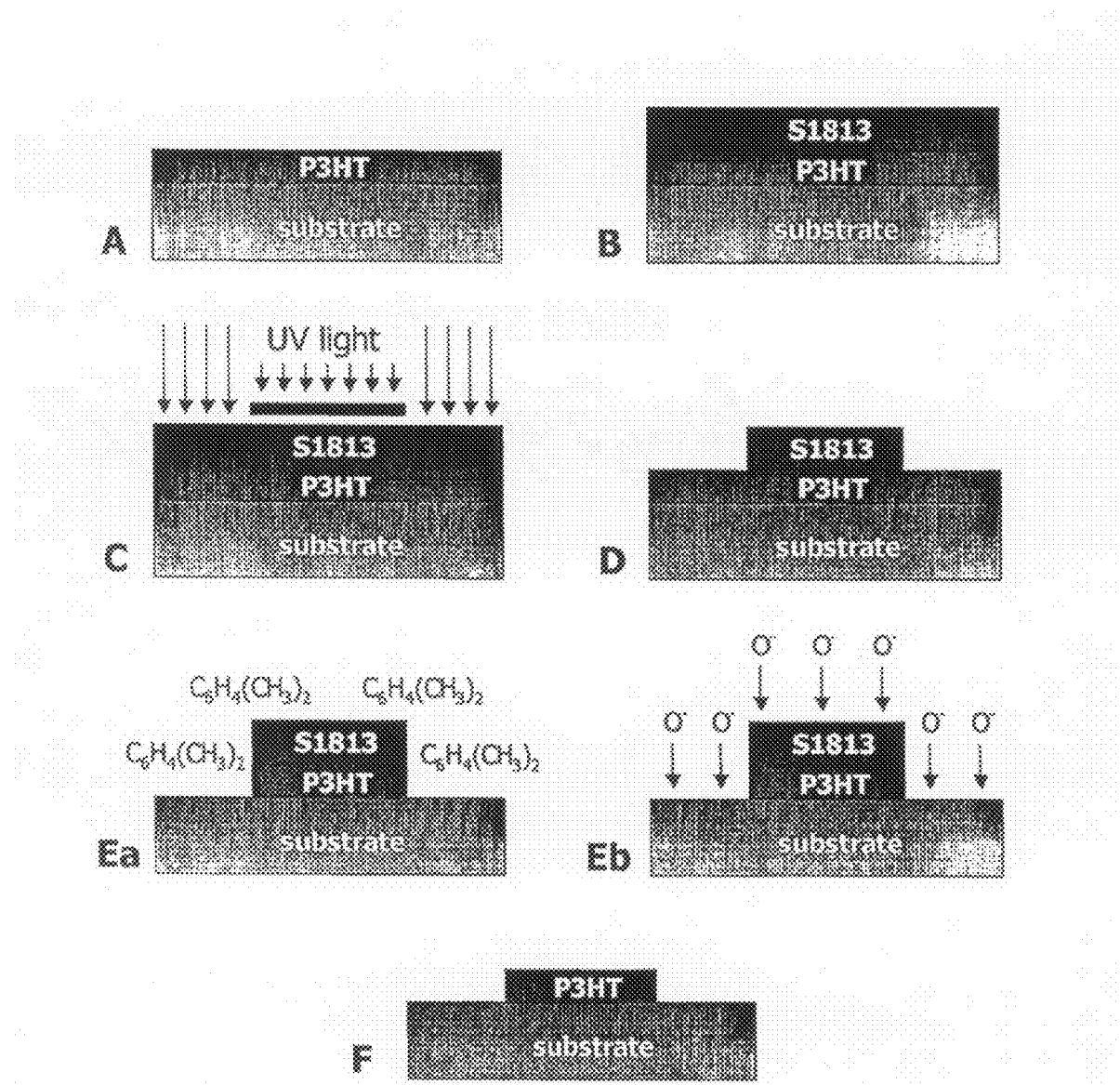
Figure 16:
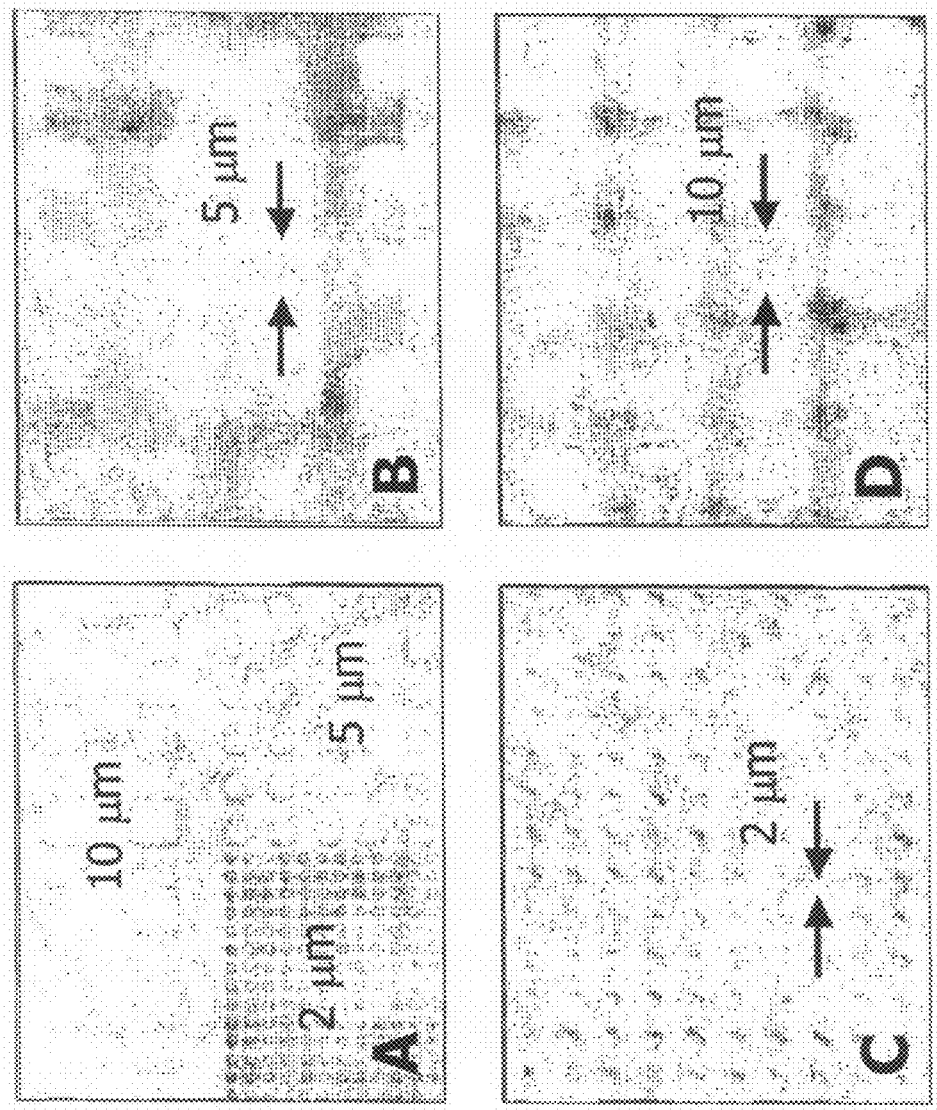
Figure 17:
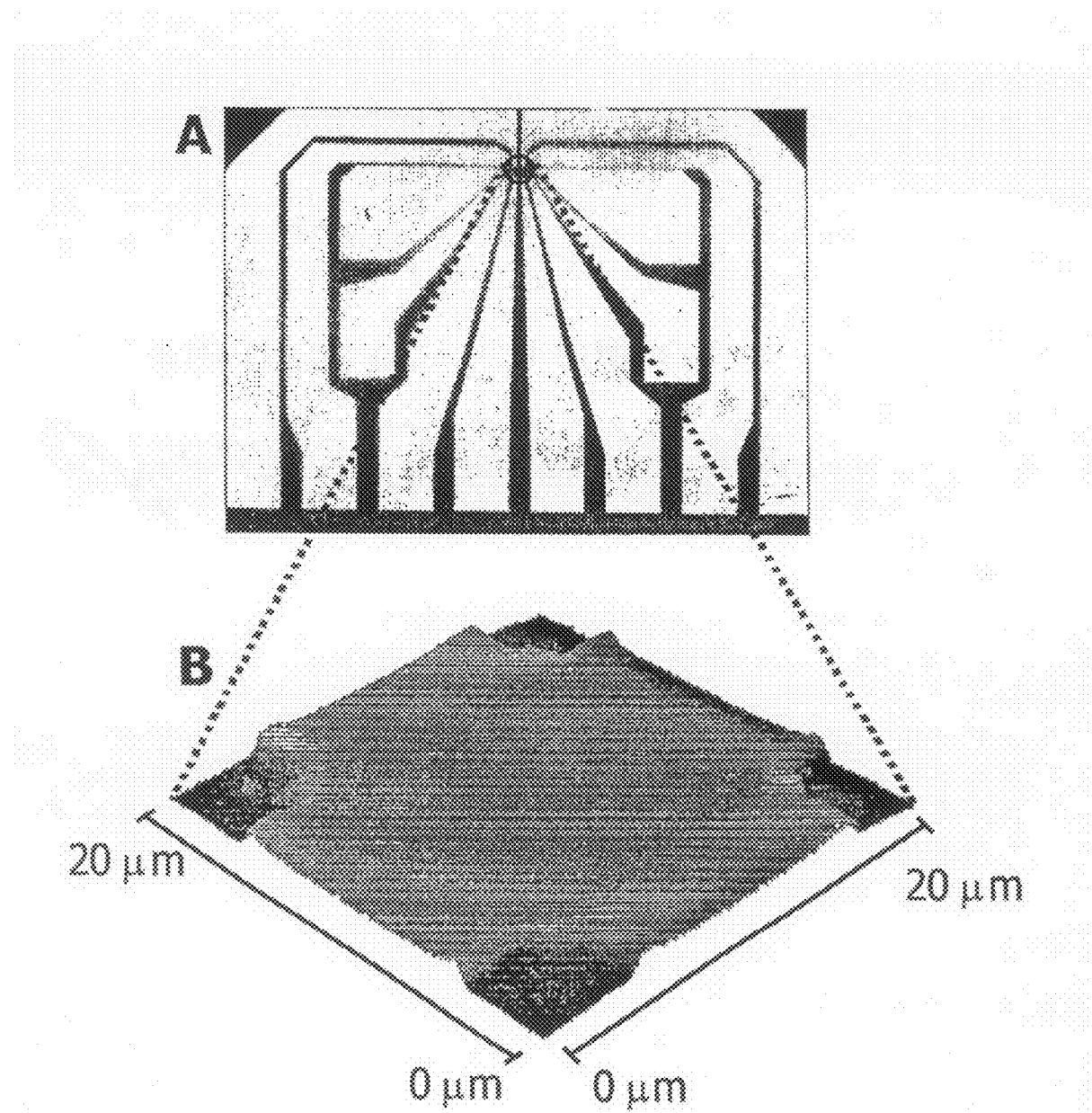
Figure 18:
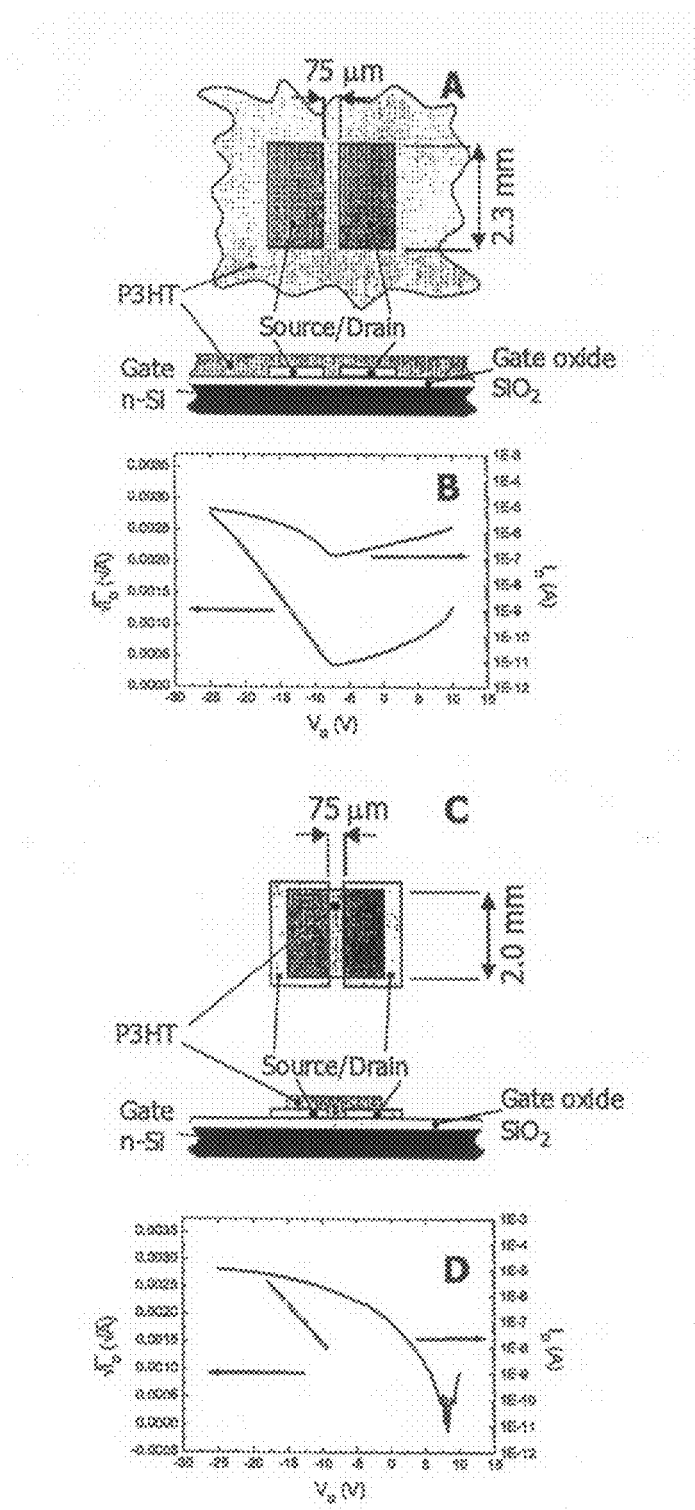
Figure 19:
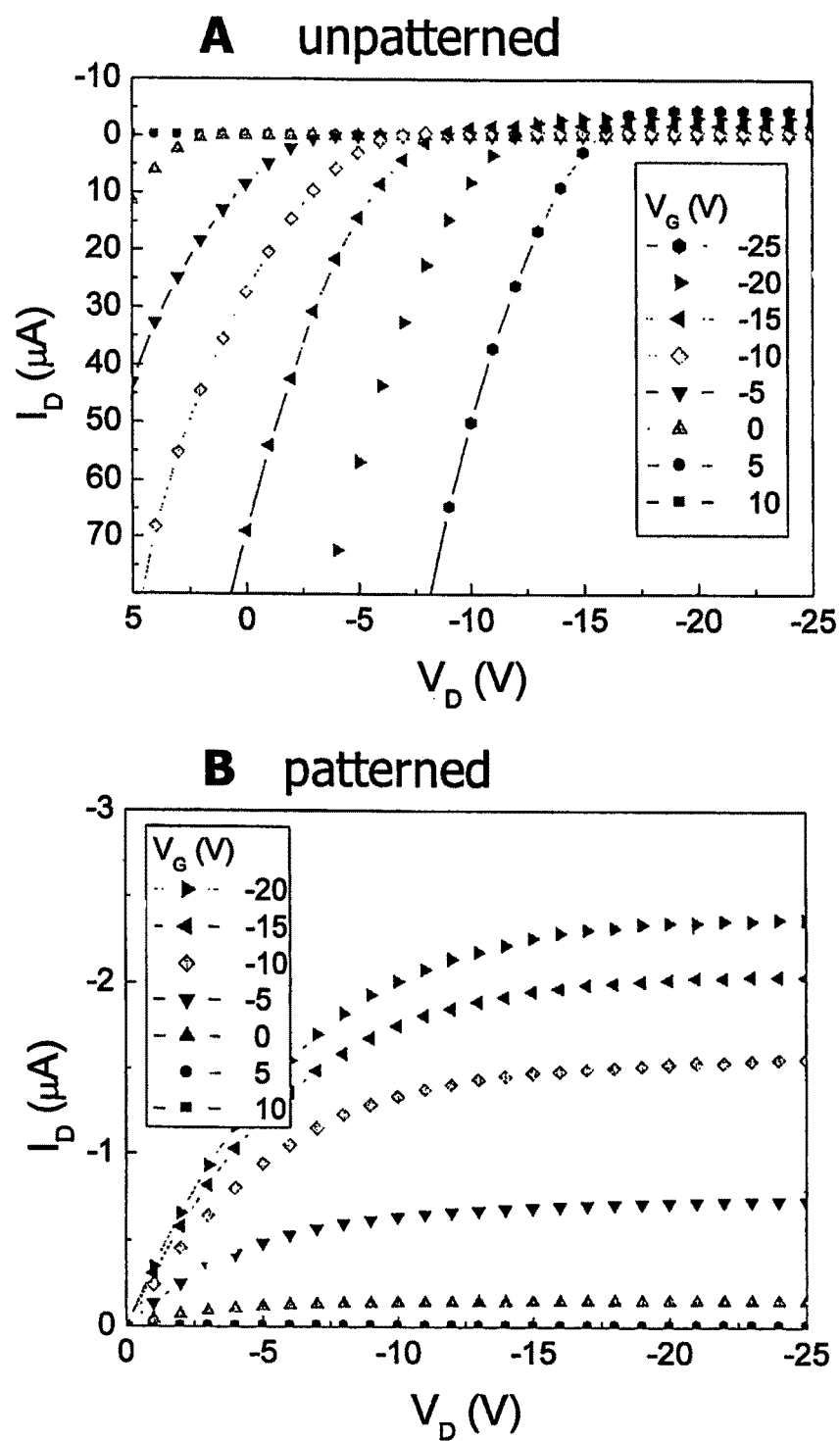
Figure 20A:
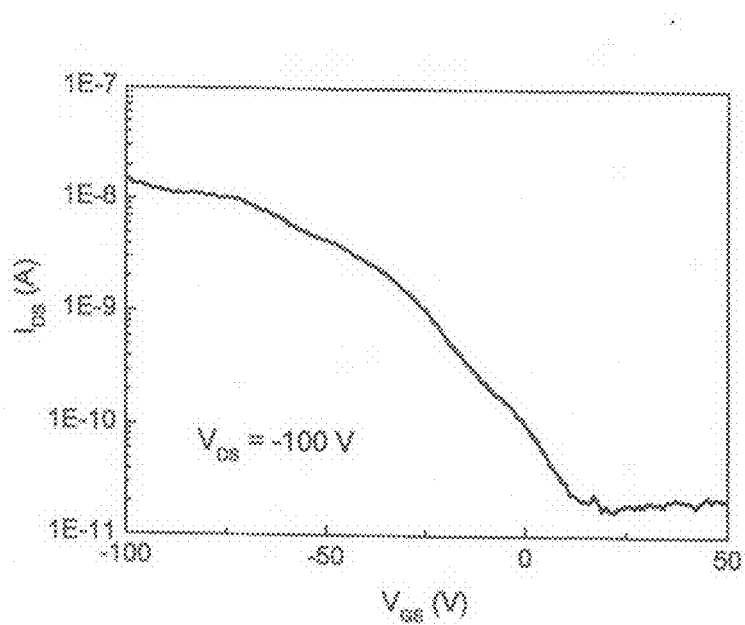
Figure 20B:
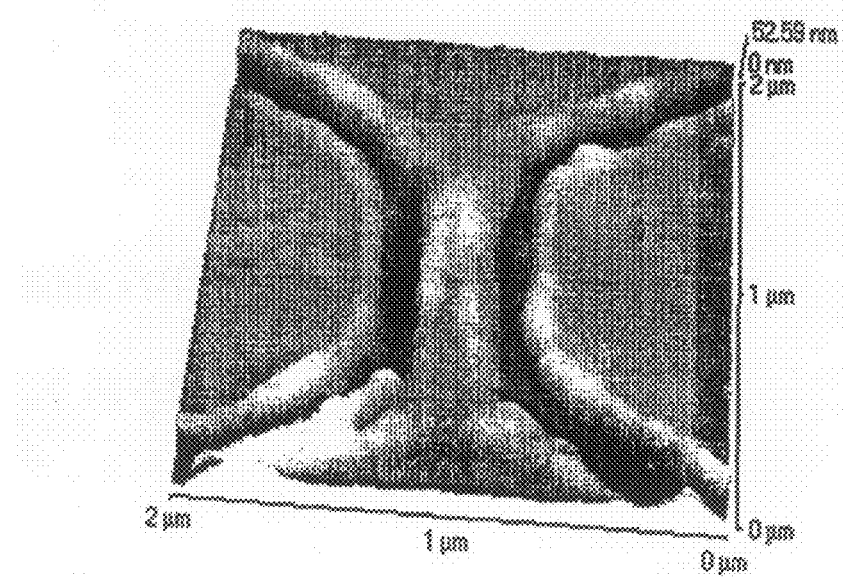

FIG. 6 indicates the frequency response of the electronic devices from approximately 100 MHz to 110 GHz at zero bias and 6 µA measured at room temperature;

FIG. 7 is a schematic diagram showing an electronic circuit comprising four linear arrays of SSDs, for full-wave rectification of microwaves;

FIG. 8 is a schematic diagram showing an electronic circuit comprising four folded arrays of SSDs, for full-wave rectification of microwaves;

FIG. 9A shows the voltage-current curve of an array of approximately 40 P3HT SSDs;

FIG. 9B shows the frequency response of the SSDs of FIG. 9A, for a sinusoidal input voltage of $V_{pp}$=20V;

FIG. 10A shows the voltage-current curve of an array of ten PQT12 SSDs;

FIG. 10B shows the frequency response up to 20 MHz of the SSDs of FIG. 10A, for a sinusoidal input voltage of $V_{pp}$=20V;

FIG. 10C shows the DC output voltage as a function of AC input voltage;

FIG. 11 illustrates (a) an optical microscope image showing a typical P3HT reacted surfaces in regions surrounding the Hall bar pattern where there is photoresist beneath, and (b) a photograph showing the results of a successful patterning process by replacing the P3HT solvent chloroform with xylene;

FIG. 12 illustrates (a) an optical microscope image of an array of 1 µM-wide gate finger patterns of P3HT, and (b) a magnified image of one of the gate finger patterns;

FIG. 13 illustrates (a) optical microscope images of typical organic thin film transistors with 10 µm and 40 µm wide P3HT channels, and (b) $I_{SD}$ versus $V_{SD}$ curves at different gate voltages ($V_G$) of an OTFT with a channel width of 40 µm and a channel length of 9 µm;

FIG. 14 is a graph of source-drain resistance normalised by the channel width (60 µm) as a function of the channel length, measured at zero gate voltage;

FIG. 15 shows schematic diagrams of the "subtraction" method lithographic processes to pattern a P3HT film: (A) P3HT film formed by spin coating on the substrate; (B) photoresist S1813 spun onto the P3HT layer after being warmed at 90° C.; (C) the photoresist exposed by UV as in the conventional photolithography, (D) after the development of the photoresist; (E) the uncovered P3HT layer removed by either wet etching in xylene (Ea) or oxygen plasma ashing (Eb); (F) the photoresist stripped off with acetone and methanol;

FIG. 16 shows optical microscope photographs showing grid-like patterns transferred into a 50-nm-thick P3HT layer: (A) patterned photoresist on the P3HT film; (B) 10 µm P3HT grid; (C) 5 µm P3HT grid; (D) 2 µm P3HT grid;

FIG. 17 shows (A) a microphotograph of a 10 µm P3HT Hall bar with Au ohmic contacts, and (B) the corresponding AFM image of the P3HT bar in the center;

FIG. 18 shows schematic diagrams and transfer characteristics of two P3HT OTFTs: (A) schematic diagram of an unpatterned OTFT; (B) the transfer characteristic of the OTFT in (A); (C) sketch of a different device after UV patterning of the P3HT film; (D) the transfer characteristic of the patterned OTFT in (C);

FIG. 19 illustrates the output characteristics of two P3HT OTFTs: (A) an OTFT with the P3HT film not patterned; (B) an OTFT with a patterned P3HT channel;

FIG. 20A shows the current-voltage characteristic ($V_{GS}$ versus $I_{DS}$ at $V_{DS}$=−100V) of a PH3T planar transistor; and FIG. 20B shows an AFM image of the transistor of FIG. 20A.

Previously, it had generally been understood that a two-dimensional charge carrier, such as a two-dimensional electron gas (2DEG) was needed to realise a planar device, such as the nanotransistor described within EP 0,464,831. A 2DEG is a thin layer of electrons that (i) share a single, well-defined, localised mode (half of the quantum wavelength of the electrons) in the direction normal to the 2DEG layer, and (ii) can move freely within the two dimensions of the layer. Just as mobile charge carriers can take the form of holes as opposed to electrons, so there also exists a 2DHG (2-dimensional hole gas).

The present inventor has realised that planar devices do not require a 2DEG or 2DHG to function, despite the general teaching of EP 0,464,831. Further, prior art explanations of the operation of planar electronic devices (e.g. nanodevices) have previously referred to the existence of the lateral depletion regions close to/adjacent the channel sidewalls. Such depletion regions are formed, in the prior art, because of the termination of crystal structure of inorganic semiconductors such as silicon or GaAs leading to surface states/traps. Such surface states/traps prevent charge carriers from being close to the sidewalls, and thus form a depletion region.

The present inventor has realised that it is not necessary for the materials forming the planar device to provide such natural depletion regions. This further opens up the possibility of additional materials/manufacturing methods available for forming planar electronic devices. For example, the present inventor has realised that suitable materials for forming planar electronic devices, as described herein, include both SOI (Silicon On Insulator) and organic semiconductors, such as P3HT (poly(3-hexyl)thiophene) and PQT12 (poly(3,3'''-dialkyl-quaterthiophene)).

The belief that a 2DEG or 2DHG was required, limited the prior art devices to including material layers suitable for forming such gases. For example, a 2DEG or 2DHG can only be realised at the interface between two different types of materials such as GaAs/AlGaAs, InGaAs/IP, or Si/SiO$_2$.

Prior art experimentation on such devices is likely to have reinforced the belief that a 2D charge carrier gas was required.

Figure 1A:
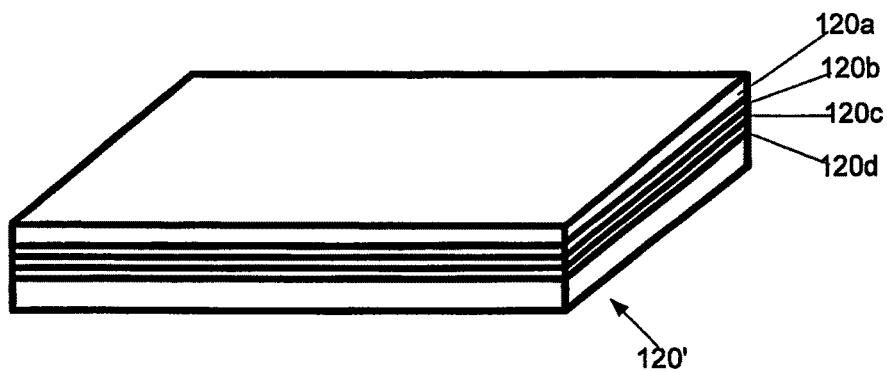
FIG. 1A is a perspective view showing the layer structure of a known self-switching diode, prior to etching of channels.

Experiments by the present inventor have indicated that devices such as the nanotransistor require a well-defined narrow channel in the layer containing the mobile charge carriers. Often, the width of the elongate channel is less than 300 nm, and typically less than 100 nm. As can be seen from FIGS. 1A-1C, the elongate conductive channel is defined between two insulating features (e.g. lines) such as trenches. As such, if the thickness of the active layer that contains conductive charge carriers is large, sidewalls very close to the vertical are required to obtain a well-defined channel width, if an etching method is used to fabricate the planar nanotransistor.

For example, the channel defined between two parallel trenches that have a V-shaped cross-section is narrower close to the sample surface, but is wider at the bottom. To fabricate almost vertical sidewalls is difficult with wet chemical etching. On the other hand, dry etching or reactive ion etching typically produces electronic damage and carrier traps in the region close to the sidewalls, thus detrimentally affecting the device performance.

However, if a material containing a 2DEG is used, then one only needs to consider the channel width at the depth of the 2DEG, thus obviating the need to create well-defined, almost vertical sidewalls over a larger distance. Thus, any attempts to create non-2DEG planar devices starting from prior art materials/manufacturing techniques, would have encountered a number of practical difficulties.

Similarly, prior art material selection was limited due to the belief that natural lateral depletion regions were required close to the channel sidewalls. There is no obvious depletion region in organic materials reported so far, thus also limiting the material selection to inorganic materials.

Further, most it is often assumed that nanodevices require high-electron mobility materials, as most nanodevices do not function unless the devices include such materials.

However, the present inventor has realised that such apparent limitations are incorrect, at least in respect of planar devices.

Figure 3A:
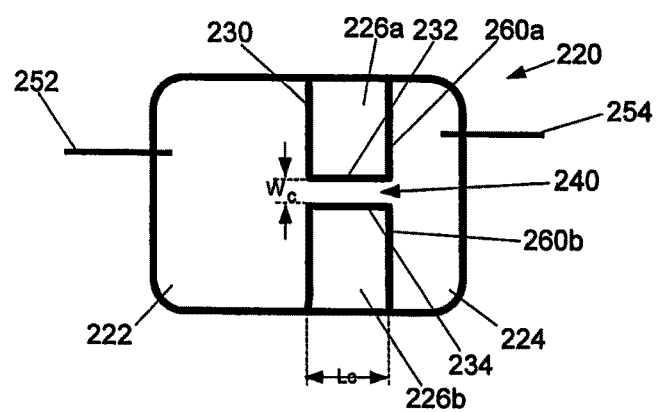
FIG. 3A is a plan view of an electronic device in accordance with an embodiment of the present invention, configured to act as a transistor.
Figure 3B:
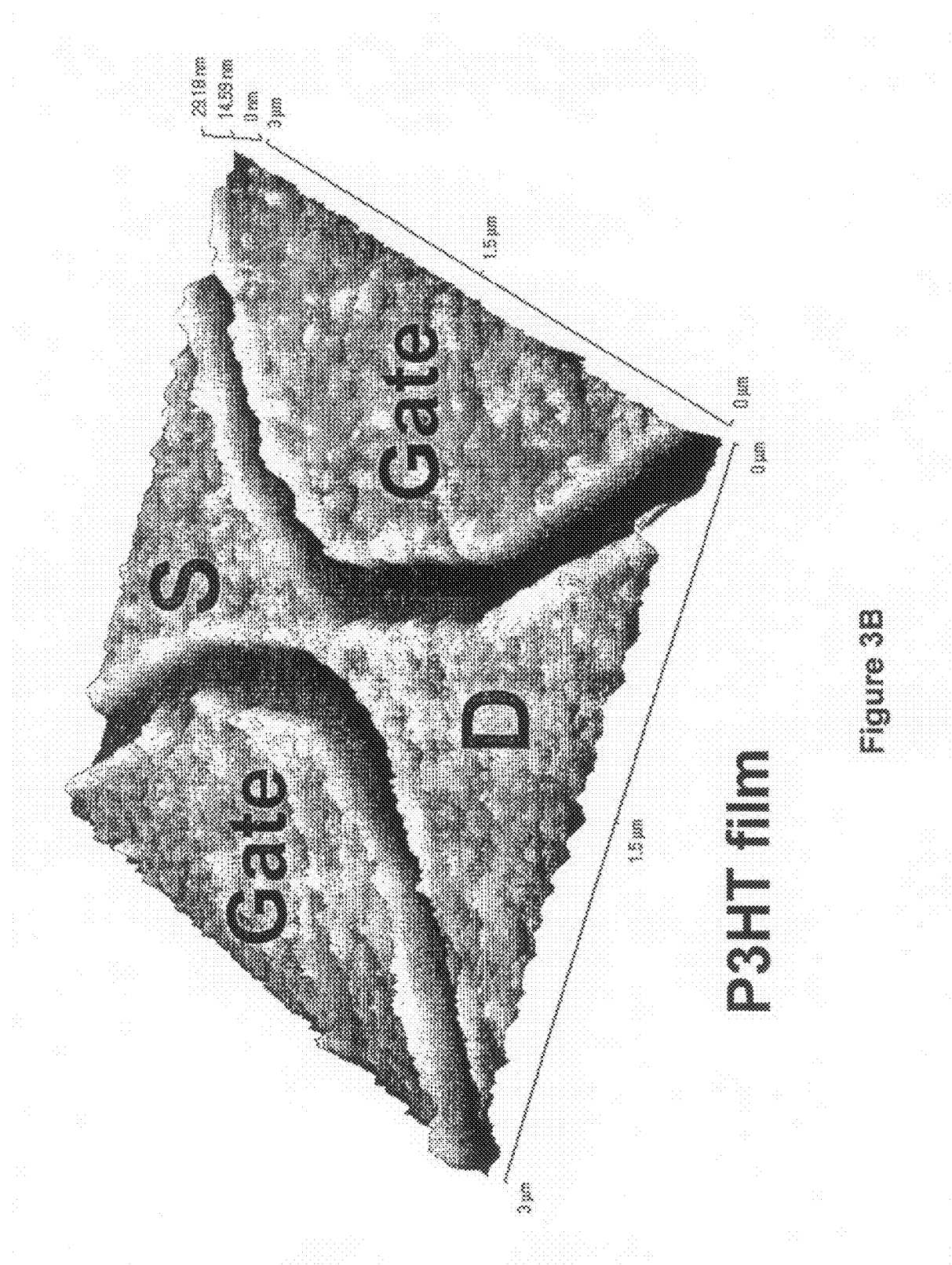
FIG. 3B is a perspective atomic force microscope image of a nanotransistor in accordance with an embodiment of the present invention.

The present inventor has realised that the transistors of the present invention, as shown in FIGS. 3A & 3B (often termed nanotransistors, due to their size) actually operate based on the field effect, in an analogous way to a conventional field-effect transistor (FET). The principal difference is that a typical FET is a vertically multi-layered structure, whereas the planar transistor is a single-layer device.

Experiments have proven that a natural depletion region is not required to form such planar devices. The sidegate voltages can, in the absence of a natural depletion region, still modulate the Fermi energy or the energy range that charge carriers occupy, and therefore modulate the allowed number of carriers inside the channel. Hence, the gate voltage can still modulate the channel conductance and provide amplifying or switching functionalities. One of the disadvantages of having no depletion layer is that it is difficult to construct normally-off transistors (i.e. zero channel conductance when no applied gate voltage). However, such need not be a problem for constructing useful circuits including such devices/components. For example, high-electron mobility transistors (HEMTs) based on compound semiconductors such as GaAs/AlGaAs, etc, have been widely used for high-speed communication applications.

If a gate voltage is applied, which has the same sign of the carrier charges during transistor operations (i.e. a negative gate voltage is applied, if the mobile charge carriers are electrons), the gate voltage will deplete (not necessarily completely) charge carriers from the channel from the top, bottom, and sides. Such depletion is the field effect. The effect can also be understood also in terms of the decrease of the Fermi energy or the energy range that the charge carriers occupy, leading to reduction in the source-drain current. If a gate voltage is applied, of opposite sign to the carrier charges during transistor operations, the voltage will enhance the channel conductance from the top, bottom, and sides, corresponding to an increase of Fermi energy.

Example planar devices will now be described with reference to FIGS. 2A-3B.

Figure 2A:
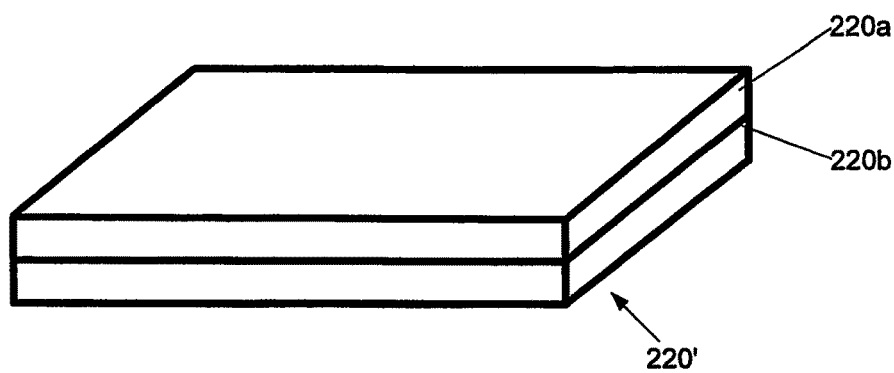
FIG. 2A is a perspective view showing the layer structure of an electronic device in accordance with an embodiment of the present invention, prior to formation of the insulative features.
Figure 2B:
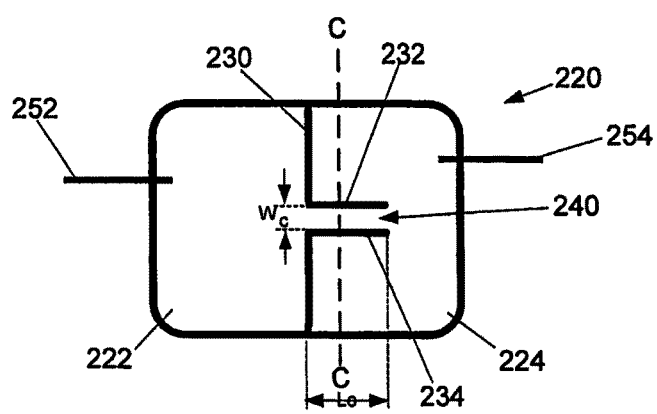
FIG. 2B is a plan view of the structure of FIG. 2A, with the insulative features formed.
Figure 2C:
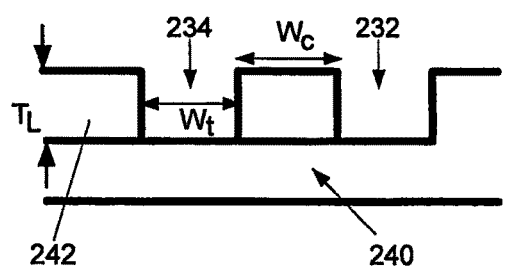
FIG. 2C is a cross-sectional view through the structure of FIG. 2B.

FIG. 2A shows a layer structure that can be utilised to form a planar device, such as the SSD 220 illustrated in FIGS. 2B and 2C, and the transistor 320 illustrated in FIGS. 3A and 3B.

FIG. 2A illustrates a wafer 220'. It will be appreciated that the wafer is relatively simple compared to the wafer structure shown in FIG. 1A. The wafer 220' comprises a laminate of two layers 220a, 220b. One layer 220a is a substrate supporting mobile charge carriers. The second layer is an insulative substrate 220b. The mobile charge carriers are not restricted to movement within two dimensions (i.e. the mobile charge carriers can be within at least two modes in each of the three dimensions within the substrate). The mobile charge carriers do not thus form a two dimensional gas.

Figure 1B:
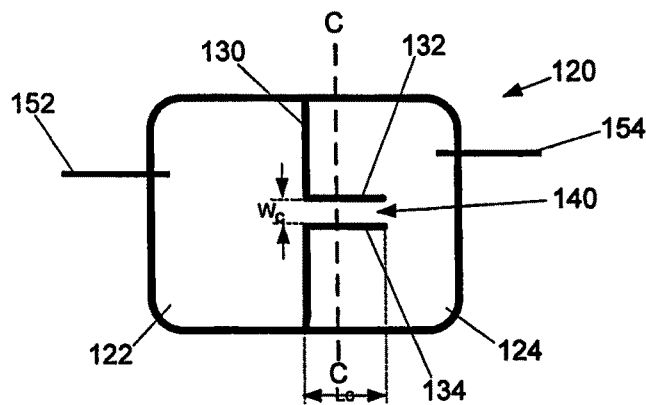
FIG. 1B is a plan view of the structure of FIG. 1A, with the channels etched.
Figure 1C:
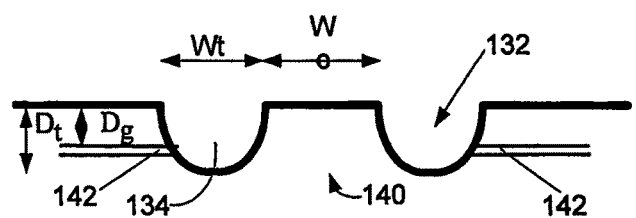
FIG. 1C is a cross-sectional view through the structure of FIG. 1B, illustrating the position of the 2DEG (two-dimensional electron gas)

FIGS. 2B and 2C show respectively a plan view, and a cross-sectional view along the line CC in FIG. 1B, of an SSD 220. It will be observed that, from a plan view, the SSD 220 can have a similar configuration to the SSD 120 illustrated in FIG. 1B. Indeed, the dimensions of the areas, channels and grooves forming SSD 220 can be the same as any, or all of, the dimensions cited with respect to the prior art SSD 120 in FIG. 1B.

Once the wafer 220' is formed, insulative features (e.g. insulating grooves) 230, 232, 234 are then formed on the surface, to provide the device functionality. The grooves 230, 232, 234 can be formed using nanolithography. The grooves 230, 232, 234 are typically etched through to the insulative substrate layer 220b.

The grooves act to separate the upper surface of the mobile charge carrier substrate 220 into two areas 222, 224. The two areas 222, 224 are connected by a channel 240 extending between, and defined by, the grooves 232, 234. The grooves 230 extend to the edges of the upper surface of the device 220, so as to separate the upper surface into two discrete areas 222, 224, with the channel 240 providing the current flow path between the two surface areas 222, 224.

The channel 240 is of width Wc and length Lc. The grooves or trenches are of width Wt, and extend to a depth of $T_L$ beneath the surface of the substrate. Typical dimensions are: $T_L$ may be between 1 nm and 1 µm (i.e. it can be greater than 10 nm, 20 nm or even 50 nm). The channel width Wc can be between 10 nm and 500 nm. The groove width Wt can be between 10 nm and 500 nm. The channel length Lc is typically 3 to 4 times the channel width Wt; Lc can be between 30 nm and 3 µm.

The conductivity of the channel is dependent upon the potential difference between the areas 222, 224 (i.e. the device functions as a diode).

As illustrated in FIG. 3A, a transistor can be realised by providing an additional insulative feature (e.g. groove) 260a, so as to define a third area 226*a* adjacent the channel 140. Applying an appropriate voltage to that area 226*a* can alter the channel conductance i.e. the area acts as the transistor gate (with areas 222, 224 acting as either source or drain). If so preferred, as illustrated in FIG. 3A, a fourth area 226*b* can also defined (by insulative feature 260*b*) adjacent the channel, on the opposite side of the channel from area 226*a* Either, or both, of areas are utilised as a gate, with a gate voltage being applied to the relevant area(s) by a respective electrode affixed to that area(s).

Figure 3C:
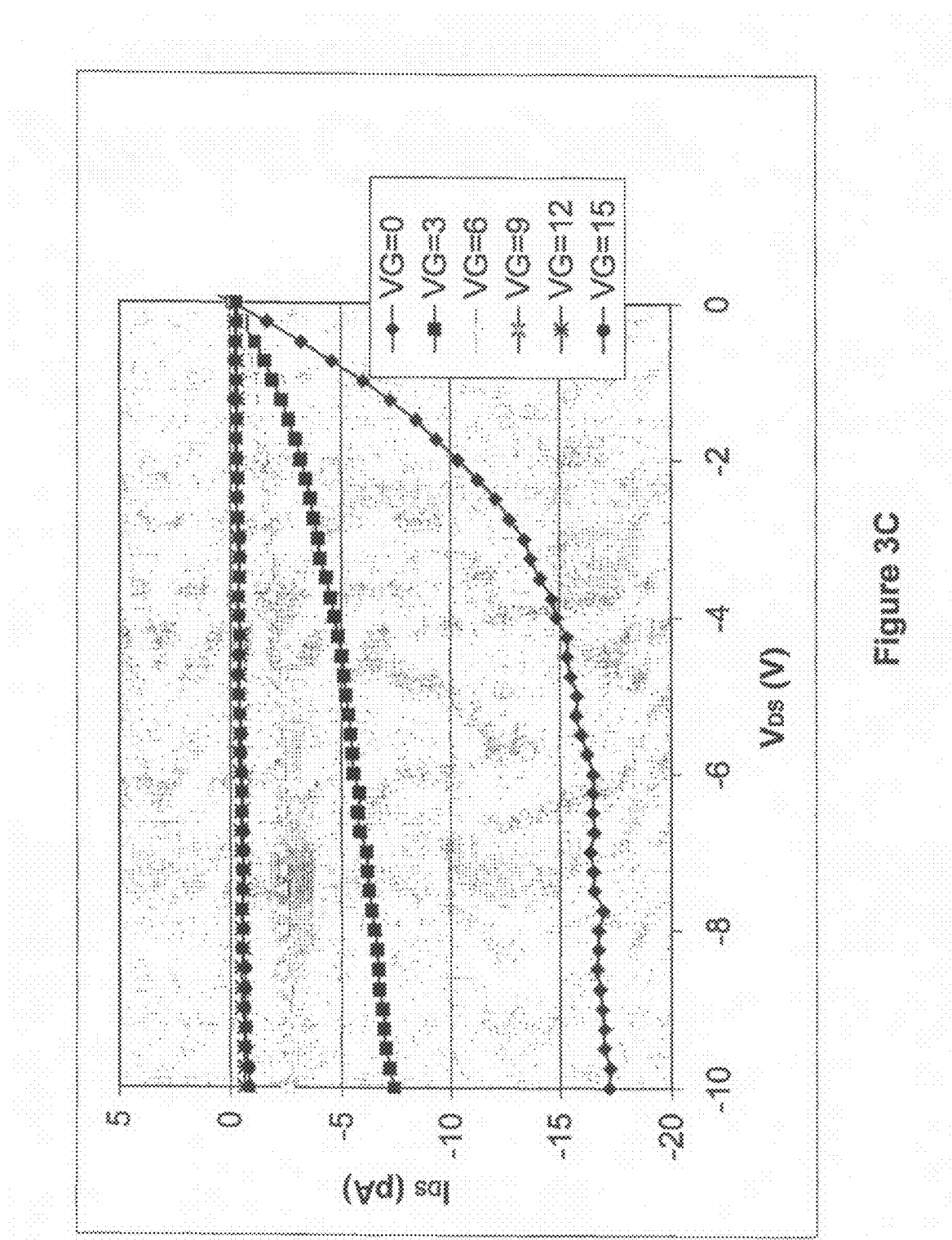
FIG. 3C is a graph indicating the drain-source current ($I_{DS}$) against drain-source voltage ($V_{DS}$) of the device in FIG. 3B, at different gate voltages ($V_G$)

FIG. 3B shows a planar transistor formed as described herein, with the gate, source (s) and drain (d) areas marked, illustrating that a "pinched" channel can be formed, instead of the parallel side conductive channel shown in FIGS. 2B and 3A. The device is formed of P3HT on an insulative substrate of $SiO_2$, without any surface treatment. The device was left in air for two days, to dope the P3HT film. The channel width is approximately 200 nm, and the trench width (used to define the insulative features) approximately 200 nm. FIG. 3C shows the output characteristics if the P3HT planar nanotransistor shown in FIG. 3B, for different gate voltages ($V_G$, in volts). In this particular example, the device has a pinch-off gate voltage (of approximately 9 volts), below which the device functions as a transistor.

It will be appreciated that the planar devices as described herein can take any of the properties (including size), or be formed in any of the configurations, or formed to provide any of the circuits described in WO 02/086973 or WO 06/008467. Further, the devices can be of different size than such devices e.g. of greater channel or groove width. The contents of WO 02/086973 and WO 06/008467 are incorporated herein by reference.

Such planar devices, as for example illustrated in FIGS. 2A-3B, can be formed from a range of materials, by a variety of methods.

For example, the mobile charge carrier substrate can be formed from semiconducting polymer, such as regioregular poly(3-hexylthiophene) (P3HT), thus resulting in working planar organic nanodevices such as nanotransistors. For example, P3HT can be doped by oxygen e.g. by exposure to air (photooxidation) or by intentionally introducing known volumes of oxygen. It is also possible to chemically dope P3HT (to become either n- or p-type semiconducting). Many such methods for doping P3HT and, indeed, most other organic semiconductor materials, e.g. polyalkylthiophenes or polyarylamines, are known. Suitable insulative substrates include silicon oxide, and mica Flexible insulative substrates could also be used, e.g. polyethylene naphthalate (PEN) or polyethylene terephthalate (PET), paper or glass. The insulative substrate surface can be treated with a layer of self-assembled monolayer, (e.g. hexamethyldisilazane HMDS) or octadecyltrichlorosilane (OTS)) or treated with fluoroalkyl-silanes (FAS), such as perfluorooctyl trichlorosilane. However, to produce functioning devices, the surface of the insulative substrate does not need to be treated.

In the hole-transport mode of P3HT, applying a positive gate voltage leads to a reduced source-drain current, and applying a negative gate voltage gives rise to a higher source-drain current. The opposite is true when the substrate is doped such that electrons act as the mobile charge carrier.

Typically, the conducting polymer films that form the layer/substrate containing the mobile charge carriers are between 5 to 100 nm thick.

The film(s) that forms the charge carrier substrate layer can be deposited by a range of solution-processing methods, including, but not limited to, spin-coating or screen-printing. Suitable materials for solution-processing can be polymers, such as polyalkylthiophenes or polyarylamines or substituted polyalkylthiophenes or substituted polyarylamines or substituted thienothiophenes, or oligomers, such as oligothiophenes.

Furthermore, suitable conducting films film(s) to form the charge carrier substrate layer can also be deposited by vacuum deposition or vapour deposition. Suitable materials for vacuum or vapour deposition can be small molecules, such as pentacene, or oligomers, such as oligothiophene, or substituted oligothiophenes.

It should be appreciated that even though such films may be relatively thin (compared with the mobile charge carrier wavelength), the films still form a 3 dimensional carrier system. There is no 2DEG, even for films of less than 5 nm thick, since there is no well-defined confinement mode in the normal direction of the film. The very low carrier mobility in organic materials, in comparison to many inorganic semiconductors, means that the carriers are scattered very frequently, and the carrier transport in any direction is rather random. Further, the charge carrier wavelength in organic materials is relatively small (e.g. less than 1 nm) compared with inorganic materials (e.g. GaAs can have an electron wavelength of 30 or 40 nm)

The elongate channel formed between the two insulating regions/features can be formed in a range of configurations. For example, the elongate channel can have a uniform width as shown in FIG. 3A, or a point-contact type of channel (see FIG. 3B), depending on the desired transistor properties.

The mobile charge carrier substrate (e.g. the films) is typically not encapsulated during the fabrication process, unlike a 2DEG/2DHG material in which the 2DEG/2DHG is embedded inside the multi-layered structure. The lithography is therefore easier than in previous cases with inorganic semiconductors. For example, insulating features can be formed by mechanically cut insulating trenches into the film as illustrated in FIG. 3B.

The insulating/insulative features in the transistor, as per the SSD of FIGS. 2A-C, need not be formed as trenches. The insulative features can be made insulating by other methods including chemical, thermal, photochemical, electrochemical approaches. For instance, insulating lines can be made by exposing the film to strong UV or excessive heat or special chemicals harmful to the conductivity, in selected areas, so as to destroy or reduce the conductivity. Alternatively, the trenches can be filled with another material e.g. a dielectric.

One of the many problems facing prior art organic electronics is the relatively low speed of operation (typically kHz or below), which is fundamentally limited by the carrier mobility. Even though miniaturisation has been the route to increasing the speed of silicon integrated circuits, standard organic thin film transistors (OTFTs) typically have a minimum dimension of a few microns, below which the metal contact resistance becomes dominant and the vertical multi-layer OTFT architecture becomes very difficult to produce at a low cost and high throughput by ink jet printing (due to the resolution limit) or other solution-processing methods.

Due to the limitations involved in aligning multiple-moulds, it is also difficult to make such OTFTs by the nanoimprint technique, in which a solid mould with accurately replicated nanometric dimensions is pressed against a thin polymer film and form a pattern of micro- or nano-structures. There are different variations of nanoimprint technique, including the ones developed by Molecular Imprints, Austin Tex. 78758-3605. Nanoimprint is a very high throughput process, which could be used for 'roll-to-roll' printing, c.f. newspapers.

Radio frequency identification, or RFID, is a generic term for technologies that use radio waves to automatically identify people or objects. There are several methods of identification, but the most common is to store a serial number that identifies a person or object, and perhaps other information, on a microchip that is attached to an antenna (the chip and the antenna together are called an RFID transponder or an RFID tag). The antenna enables the chip to transmit the identification information to a reader. The reader converts the radio waves reflected back from the RFID tag into digital format that can then be passed on to a computer for processing.

An RFID system consists of a tag, which is made up of a microchip with an antenna, and an interrogator or reader with an antenna. The reader sends out electromagnetic waves. The tag antenna is tuned to receive these waves. A passive RFID tag draws power from field created by the reader and uses it to power the microchip's circuits. The chip then modulates the waves that the tag sends back to the reader and the reader converts the new waves into digital data RFID systems use many different frequencies, but the so-called high-frequency (13.56 MHz) tags work better on objects made of metal and they can work around goods with high water content. 13.56 MHz RFIDs are therefore predicted to have a huge market value if the cost is reduced to an acceptable level.

The present inventor has realised that a significantly improvement in the speed of organic electronics may be realised, from KHz to MHz, by employing self-switching diodes (SSD) e.g. of the general configuration as described herein and in WO 02/086973. This speed improvement will significantly enhance the applicability of organic electronics, such as RFIDs, driving circuits for real-time organic or flexible displays and organic-based memory.

One of the common problems affecting the frequency response of nanodevices is the high impedance between their terminals, which causes most of the applied power (usually delivered by a characteristic impedance 50Ω terminated RF source) to be reflected. High impedance also causes serious vulnerability to parasitic capacitance, and generally results in a long RC response time.

Two terminal self-switching diode devices in contrast, as realized by the present inventor, have intrinsic capability for operating at high frequencies, due to the planar architecture of the devices, which means the electrical contacts are laterally separated rather than placed on the surface and the back side (substrate). This leads to substantially lower parasitic capacitance between contacts than in a conventional vertical device of the same size. Furthermore, the working mechanism of such SSD does not rely on any minority carrier diffusion and no barrier structure is used along the current direction at all. Without being significantly limited by the above factors that normally determine the speed of conventional semiconductor diodes, the SSD functions at very high frequencies. The frequency is strongly dependent on the substrate, but for low mobility substrates as envisaged herein, MHz operation is possible (and has been achieved).

For the purpose of the present specification, an "RF device" is intended to mean a device, at least part of which is operative at frequencies at least between 0.5 MHz and 400 MS, and preferably between 0.5 MHz and 1 GHz.

Like most nanostructures, an SSD has very high impedance, typically in the order of MΩ to GΩ. What differentiates the SSD from other nanodevices, is that the two-terminal nature makes it straightforward to integrate many SSD in parallel and form an array, without the need for any extra lithography step to make interconnects. Not only is it possible to design a linear array where all the nanowires lay along a single line, but also far more complicated structures.

The impedance depends on the material mobility and carrier concentration and the number of devices integrated in parallel. The impedance may therefore be selected as desired, dependent on the current requirement by the circuit to be driven; if more current is needed, we can simply put more SSDs in parallel, due to the impedance scalability.

For example, within a 200 μm by 200 μm area, which is very small in relation to conventional RFIDs, one can put at least 10,000 SSDs in parallel. The SSD arrays should be able to generate sufficient DC current (proportional to the number of SSDs). If necessary 1,000,000 SSDs can be placed in parallel within 1 square mm, without seriously harming the RF performance.

In a passive RFID working at 13.56 MHz, the most demanding part in terms of the speed is the rectifier, which has to be fast enough to draws DC power from field created by the reader and use it to power the microchip's circuits. The rectifier can be particularly conveniently made of SSDs, and more importantly a high-enough speed can be achieved, as described below.

Whereas SSDs can be used alone to produce rectifier for RFID, which is the most speed-demanding part, and therefore also the currently most difficult in an RFID to realise, other electronic circuits in an organic RFID can be made either using conventional vertical structured transistors and diodes or with SSDs and transistors formed in a similar manner to SSDs—see for example FIGS. 3A to 3C as described above, or FIG. 11 of WO 02/086973. The present inventor has shown that such transistors can be realised with a thin layer of organic semiconductors.

Such SSD arrays cannot only be used as an RF rectifier but also RF mixer and modulator, which is also an important speed-demanding component in an RFID. One can use the same SSD array for both rectification and RF modulation to send signal back to the reader. In this application, the SSD can be used as RF modulator, too, based on its nonlinearity I-V characteristic and high speed.

As regards the material, self-switching devices can be made on any organic or inorganic semiconductor film that has low-enough surface roughness for the sake of nanolithography, high-enough mobility for the desired speed of operation, and some level of either n or p type doping to allow the self-switching effect to function at zero bias. If required, the lifetimes of materials (such as P3HT), can be improved with the aid of controlled environment and encapsulations.

Suitable inorganic materials are solution processed semiconductor nanoparticle (or quantum dot) materials, which can be spin coated or drop cast. They can be as easily used as organic semiconductors, but almost certainly have a longer lifetime, better mobility and may be better controlled. The cost is quite low since they are synthesised using chemical methods, Regarding organic semiconductors, there are two basic types: semi-conducting polymer, typically represented by polyarylamines or polyakylthiophenes (e.g. poly(3-hexylthiophene, P3HT)), and small molecules, with pentacene as the most studied and also the best. References for P3HT are A. Tsumura, H. Koezuka, and T. Ando, Appl. Phys. Lett. Vol. 49, 1210 (1986); H. Sirringhaus, N. Tessler, and R. H. Friend, Science, Vol 280, 1741 (1998). For pentacene, H. Klauk, M. Halik, U. Zschieschang, G. Schmid, W. Radlik, and W. Weber, J. Appl. Phys. 92, 5259 (2002); D. J. Gundlach, C.-C. Kuo, S. F. Nelson, and T. N. Jackson, 57th Annual Device Research Conference (1999), pp. 164-165. J. Collet, O. Tharaud, A. Chapoton, and D. Vuillaume, Appl. Phys. Lett.

76, 1941 (2000). Y. Zhang, J. R Patta, S. Ambily, Y. Shen, D. C. Ralph, and G. G. Malliaras, Adv. Mater. (Weinheim, Ger.) 15, 1632 (2003).

The films mentioned above are formed on insulative substrates, and we can use any insulative substrate that accepts a thin semiconductor film mentioned above. This includes flexible substrates such as poly(ethylene)terephthalate (PET) and poly(ethylene)naphthalate (PEN). However, the invention is not limited to such materials. For substrates, they can be silicon [A. R. Brown, A Pomp, C. M. Hart, and D. M. de Leeuw, Science 270, 972 (1995); Y. Y. Lin, A. Dodabalapur, R. Sarpeshkar, Z. Bao, W. Li, K Baldwin, V. R. Raju, and H. E. Katz, Appl. Phys. Lett. 74, 2714 (1999); B. K. Crone, A. Dodabalapur, R Sarpeshkar, R. W. Filas, Y. Y. Lin, Z. Bao, J. H. O'Neill, W. Li, and H. E. Katz, J. Appl. Phys. 89, 5125 (2001]), glass [H. Klauk, D. J. Gundlach, and T. N. Jackson, IEEE Electron Device Lett 20, 289 (1999); H. Sirringhaus, T. Kawase, R. H. Friend, T. Shimoda, M. Inbasekaran, W. Wu, and E. P. Woo, Science 290, 2123 (2000); H. E. A. Huitema, G. H. Gelinck, J. B. P. H. van der Putten, K. E. Kuijk, K. M. Hart, E. Cantatore, and D. M. de Leeuw, Adv. Mater. (Weinheim, Ger.) 14, 1201 (2002)]; polyimide [C. J. Drury, C. M. J. Mutsaers, C. M. Hart, M. Matters, and D. M. de Leeuw, Appl. Phys. Lett. 73, 108 (1998); G. H. Gelinck, T. C. T. Geuns, and D. M. de Leeuw, Appl. Phys. Lett. 77, 1487 (2000); F. J. Touwslager, N. P. Willard, and D. M. de Leeuw, Appl. Phys. Lett. 81, 4556 (2002)], polyethylene naphthalate (PEN) IM. G. Kane, J. Campi, M. S. Hammond, F. P. Cuomo, B. Greening, C. D. Sheraw, J. A. Nichols, D. J. Gundlach, J. R. Huang, C. C. Kuo, L. Jia, H. Klauk, and T. N. Jackson, IEEE Electron Device Lett. 21, 534 (2000); C. D. Sheraw, L. Zhou, J. R. Huang, D. J. Gundlach, T. N. Jackson, M. G. Kane, I. G. Hill, M. S. Hammond, J. Campi, B. K Greening, J. Francl, and J. West, Appl. Phys. Lett. 80, 1088 (2002)], polyethylene terephthalate (PET) [J. A. Rogers, Z. Bao, A. Dodabalapur, and A. Makhija, IEEE Electron Device Lett. 21, 100 (2000); P. Mach, S. J. Rodriguez, R. Nortrup, P. Wiltzius, and J. A. Rogers, Appl. Phys. Lett. 78, 3592 (2001); J. A. Rogers, Z. Bao, K Baldwin, A. Dodabalapur, B. Crone, V. R. Raju, V. Kuck, H. Katz, K Amundson, J. Ewing, and P. Drzaic, Proc. Natl. Acad. Sci. U.S.A. 98, 4835 (2001); W. Fix, A. Ullmann, J. Ficker, and W. Clemens, Appl. Phys. Lett. 81, 1735 (2002)], polycarbonate [S. K. Park, Y. H. Kim, J. I. Han, D. G. Moon, and W. K. Kim, IEEE Trans. Electron Devices 49, 2008 (2002)], and even paper [F. Eder, H. Klauk, M. Halik, U. Zschieschang, G. Schmid, and C. Dehm, Appl. Phys. Lett. 84, 2673 (2004)].

The mobility for the materials of the novel RF devices described herein is generally larger than $0.1\ cm^2/Vs$, which is readily achievable in industry at present. If the carrier concentration is high, a lower mobility might also be suitable but would preferably be greater than $0.01\ cm^2/Vs$. As regards a maximum mobility, this could be $100\ cm^2/Vs$, based on currently available materials, though this figure may increase in the future as better materials become available. The higher the mobility the higher the operation speed. The common feature of all the materials mentioned above (semiconducting polymers, small molecules, and solution-processed inorganic semiconductors), in contrast to traditional semiconductor materials (III-V or silicon), is the ease and low-cost of the processing, particularly the possibility of spin-coating, drop-casting, and simple thermal evaporations. These allow very large area mass production and therefore low cost. Other advantages include mechanic flexibility, etc.

The drastic difference of SSDs to conventional Organic Thin Film Devices (OTFD) devices is the planar device architecture and, therefore, the requirement for only a single, reproducible step of nanolithography for manufacture. The immediate advantages are (a) high-resolution multi-layer alignments are no longer needed, allowing high-throughput manufacturing by the nanoimprint technique; (b) most interconnects are made in-plane with the organic semiconductor itself and most metal connections (gates and ohmic contacts) can be avoided (more to be explained later), so that the contact resistance problem no longer limits the device miniaturisation (and therefore the speed).

The self-switching diode, as described herein, is based on a nanochannel i.e. a relatively small channel, typically of width around 10's-100's nm, with an intentionally broken geometric symmetry. Unlike a conventional diode, however, the SSD can be made to have a predetermined threshold voltage from virtually zero to more than 10 V by simply adjusting the channel width. The nanochannel is typically defined between two etched (therefore insulating) trenches that tailor a thin semiconductor layer. The L-shape of the trenches assures that the geometric symmetry of the nanochannel is broken and also forces electrical current to flow only through the nanochannel. When no voltage is applied across the wire, the nanochannel is largely depleted because of the surface states on the sidewalls of the trenches. When a negative voltage is applied, the negative charge around the nanochannel further depletes the wire itself, making it difficult for the current to flow. On the other hand, when a positive voltage is applied, the positive charges around the nanochannel induce electrons into the nanochannel, forming a conductive channel for the current to flow easily. This self-switching mechanism leads to a diode-like behaviour.

The self-switching devices can operate at high frequencies. This is due to the planar architecture of the devices, which means the electrical contacts are laterally separated rather than placed on the surface and the back side (substrate). This leads to substantially lower parasitic capacitance between contacts than in a conventional vertical device of the same size. Furthermore, the new working mechanism does not rely on any minority carrier diffusion and no barrier structure is used along the current direction at all. Without being much limited by the above factors that normally determine the speed of conventional semiconductor diodes, the SSD is expected to function at very high frequencies.

To test the speed of SSDs, experiments were first performed using InGaAs based SSDs. In the experiments, microwaves were successfully detected up to 110 GHz, which was the highest achievable frequency of the experimental setup. A detection sensitivity of 1300 mV/mW was achieved, which is about three times of that of a typical commercial microwave diode detector (about £1,000 each). No obvious decrease in the microwave detection sensitivity was observed when the frequency was increased over three orders of magnitude from 100 MHz to 110 GHz. This is, it is believed, the highest speed reported in various types of novel electronic nanodevices to date. Scaling of the speed with the carrier mobility, shows that MHz operations can be achieved using organic semiconductors (mobility $0.1\ cm^2/Vs$ or above), which therefore provides a solution to the biggest obstacle to a vast scope of applications of organic electronics.

Figure 4:
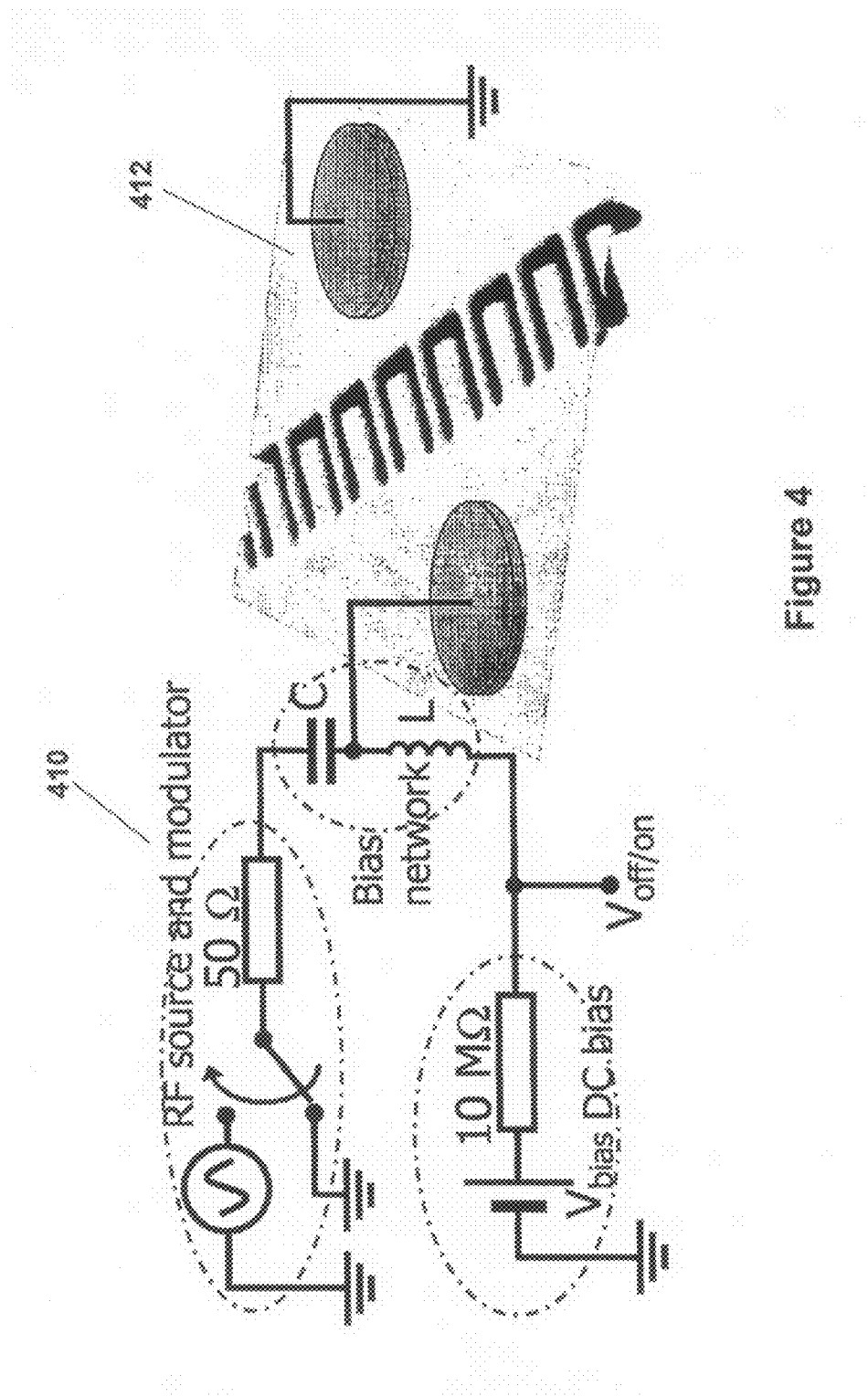
FIG. 4 is a schematic diagram of experimental apparatus for measuring the radio frequency response of electronic devices.

FIG. 4 shows a schematic diagram of the experimental apparatus used to perform the microwave experiment. A radio-frequency source and modulator 410, capacitor C and inductor L act as a bias network, whilst DC bias is provided by voltage source $V_{bias}$ and the adjacent 10 MΩ resistor.

Figure 5:
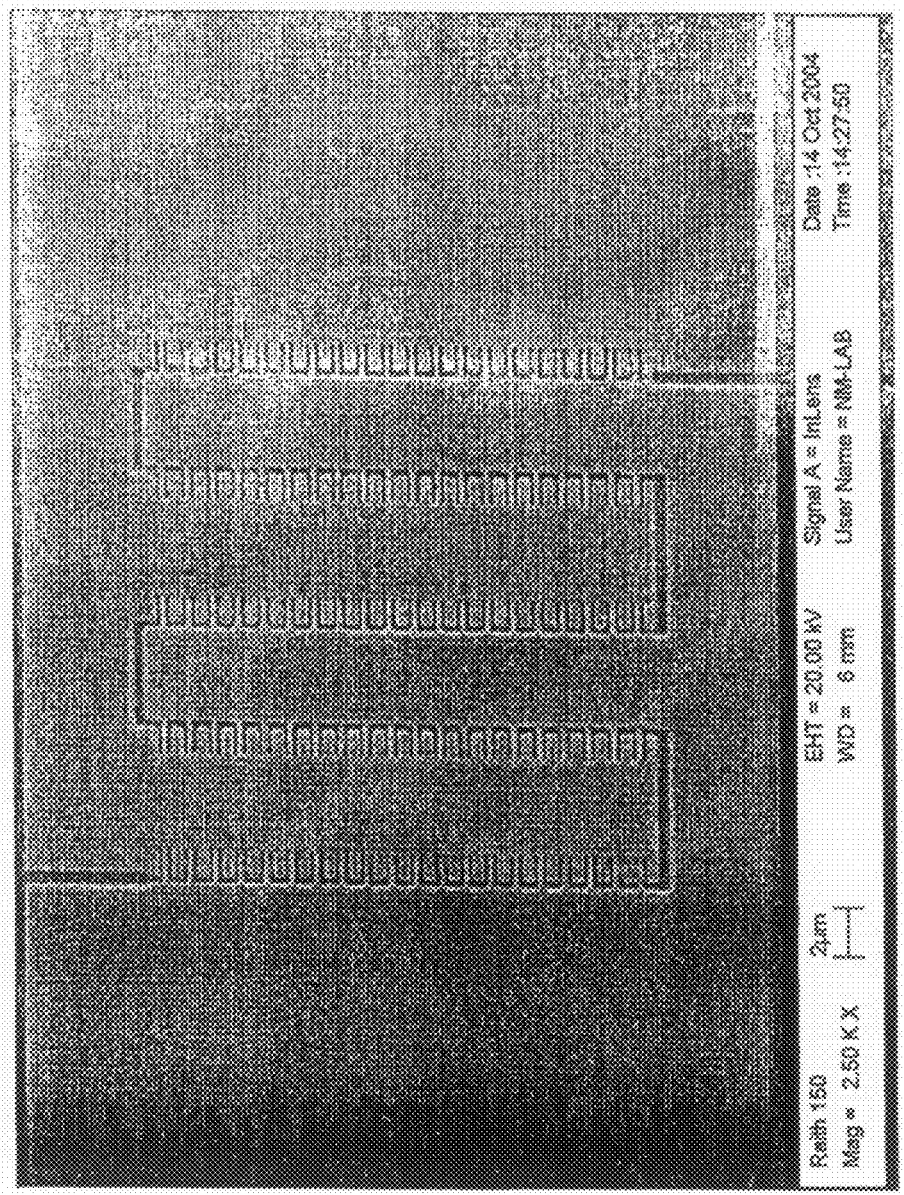
FIG. 5 is a scanning electron micrograph of approximately 100 electronic devices in parallel, fabricated on an InGaAs—InP substrate.

The atomic-force microscope image 412 at the right hand side of FIG. 4 shows a linear array of such SSDs, connected in parallel. Like most nanostructures, a single SSD has a very high impedance, typically in the order of MΩ. What differentiates the SSD from other novel nanodevices, such as the ballistic rectifier or the three-terminal ballistic junction, is that the two-terminal nature makes it straightforward to integrate many in parallel and form an array, without the need for any extra lithography step to make interconnects. Not only is it possible to design a linear array where all the SSDs lie along a single line, but also far more complicated structures. For example, the right hand side image in FIG. 4 shows how U-shaped trenches (each made of two L shaped trenches) define a number of SSDs in parallel. Furthermore, it is easy to fold such linear array as many times as required, as shown in FIG. 5, where about 100 SSDs were connected in parallel. In this way a big area, even an entire wafer, could be turned into an active material. Unlike classic diodes, the planar structure also allows a direct coupling to free-space radiation, with a perpendicular incidence onto the array. Such a feature is very useful in rectifying microwaves in practical applications such as RFID.

The SSDs in this 110 GHz experiment were fabricated from a modulation-doped InP/InGaAs/InP quantum well wafer, grown by metal-organic vapour phase epitaxy (MOVPE). The 2DEG in the quantum well was 41 nm below the surface. The SSDs were defined by electron-beam lithography followed by HBr-based wet etching of the L- or U-shaped trenches. The simple planar architecture of the SSDs allowed the fabrication of an array of many elements still in a single high-resolution lithography step, without the need for interconnection layers, as shown in the atomic-force microscope picture in FIG. 4.

FIG. 6 shows the detected output voltage $V_{out}$ as function of frequency. The first trace was measured with a bias current $I_{bias}$=6 µA while the second was without any bias applied. The power was kept constant to about 280 µW in the measurements. As can be seen, both traces show the same features in the frequency dependence. It is believed that these features were due to the measurement setup and the substrate layout (i.e. mesa and metallisations) rather than the actual device or noise.

The experiments showed that the rectification by SSDs had a stable frequency response as the frequency increased by three orders of magnitude from 100 MHz to 110 GHz (the highest frequency of the experimental setup).

The rectifying circuit can be like in FIG. 4 (single linear array) or FIG. 5 (folded array) and if used along, only half-wave rectification is realised. Two designs of full wave rectifiers are shown in FIGS. 7 and 8.

FIG. 7 is schematic diagram of a full-wave rectification of microwaves based on four linear arrays of SSDs. The functionality is similar to that of a bridge rectifier but the novel working principle allows a planar architecture, and the SSDs in each linear array are connected without any interconnects.

FIG. 8 schematically show how four folded arrays of SSDs can be used to build a rectifier, for full-wave rectification of microwaves. With folded SSD arrays, it is possible to integrate a large number of SSDs and make the microwave rectification more effective. The functionality is similar to that of a bridge rectifier but the novel working principle allows a planar architecture, and the SSDs in each folded array are connected without any interconnects. In such a way, a large area of an organic semiconductor film can be turned into a rectifier, serving as the microwave power converter to drive other circuits of an RFID. The device is able to rectify microwave coming from the normal direction of the surface. It can also be used as the nonlinear component in an RFID to modulate the microwaves that the tag sends back to the reader and the reader converts the modulated waves into digital data.

The planar architecture makes it possible to use nanoimprint technique to make the SSD arrays, which has the advantage of high-throughput and high resolution. Some additional large components, electrodes and other contacts can be made by either another level(s) of nanoimprint, since no accurate alignments are needed, or other standard techniques, such as ink jet printing, etc.

Apart from nanoimprint, industrial standard UV lithography can also be applied. Photolithography in the silicon industry can already produce 90 nm features, which is sufficient to make SSDs. The advantage of this mass production approach is that it is CMOS compatible. It is often, however, important to avoid UV exposure to the semiconductor polymer materials during the production.

SSD patterns may be made by creating insulative trenches on an uniform film, but can also be formed by many other means of generating insulative lines. For example by UV exposure, heat, mechanical or chemical treatment, but also through selective deposition of the active material in desired areas (masking).

The speed of inorganic SSD arrays has been proven to be at least of the order of 100 GHz. By scaling the frequency with the carrier mobility, it will be appreciated that organic SSD array-based rectifiers shown in FIGS. 7 and 8 can function at MHz frequencies when suitable organic semiconductor materials are used, as has been proven by experimental evidence.

For example, experiments have shown an array of P3HT SSD's reaching 1 MHz. FIGS. 9A and 9B show respectively the current-voltage curve of the array, and the SSD frequency response at a sinusoidal peak-peak input voltage (Vpp) of 20V. It will be observed that the frequency response at the 3 dB point is approximately 1 MHz. The array consisted of approximately 40 SSDs arranged in parallel (e.g. see right hand side of FIG. 4). The substrate carrying the mobile charge carriers was a film of P3HT approximately 20 nm thick, on an insulative substrate of OTS-treated mica. The SSDs were formed using trenches as insulative features, the trenches being approximately 50 nm wide. The channel width was about 500 nm, and of length 850 nm. The device was left in air for 2 days, to dope the P3HT film.

Even better performance has been shown by an array of PQT12 SSDs, which reached at least 20 MHz. FIGS. 10A-10C show respectively the current-voltage curve of the array, the SSD frequency response at a sinusoidal peak-peak input voltage of 20V, and the DC output voltage as a function of AC input voltage. The frequency response at the 3 dB point is approximately 30 MHz, although experimental measurements could only be performed up to 20 MHz. The array consisted of 10 SSDs arranged in parallel. The substrate carrying the mobile charge carriers was a film of PQT12 approximately 20 nm thick, on an insulative substrate of OTS-treated mica. The SSDs were formed using trenches as insulative features, the trenches being approximately 200 nm wide. The channel width was about 500 nm, and of length 1 µm. The device was left in air for 7 days, to dope the PQT12 film.

Such organic planar diodes (e.g. SSDs) and transistors, as described above, can be fabricated using a variety of techniques, which will be apparent to the skilled person, based upon the teachings herein. Typically, the present inventor has formed such devices using a three step process.

Firstly, a film or layer of organic semiconductor material (for holding the mobile charge carriers) is formed on an insulative substrate (typically, the electrode regions will also be formed during this first step). Secondly, the organic film is patterned (e.g. using UV photolithography) to define regions of suitable size for the final lithography step used to form the devices e.g. regions typically dimensioned of the order of micron, or tens of microns, suitable for nanolthography. Finally, nanolithography is then performed, using an AFM (atomic force microscope) to define the structures of individual devices i.e. to form the insulative trenches used to define the conductive channel.

Examples of the three steps used to form the devices will now be described in more detail. It should be noted that the materials listed within these steps are simply examples, and that other materials may be utilised, as listed elsewhere within the present application, or as will be apparent to the skilled person based upon the teachings herein.

The first step, typically used to form the initial film or layer of organic semiconducting material, will now be described.

Atomically flat mica slides (Agar Scientific Ltd., UK) were generally used as insulative substrates. The samples were degreased in acetone and methanol (Reagent Grade, Aldrich), washed several times in high purity deionised water Millipore Q, $R_s > 18$ M$\Omega$cm), and finally dried under pure nitrogen. Subsequently, an array of 50-75 nm thick gold film (99.99%, Goodfellow) is defined using photolithography and lift-off to form electrodes. Typically, the channel length between the electrodes is L=8 μm and the channel width W=80 μm.

Then, self-assembled monolayers (SAMs) for example, 1,1,1,3,3,3-hexamethyldisilazane (HMDS, 99.9%, Aldrich) or n-octadecyltrichlorosilane (OTS, 90+%, Aldrich), are formed on the cleaned substrates by immersion in 5% wt of HMDS in toluene (HPLC Grade, Aldrich) at 70 C for 3 hours or in a 1 mM OTS solution in cyclohexane (HPLC Grade, Aldrich), respectively. SAMs form stable, well-ordered and robust layers [L. Houssiau, P. Bertrand, *Applied Surface Science,* 203-204, 580 (2003)]. Essentially, the OTS-treatment should be performed below threshold temperature $T_C$ of the SAM formation ($T_C$ of OTS≈28° C.). Only below $T_C$ can well-ordered monolayers form [J. Duchet, B. Chabert, J. P. Chapel, J. F. Gerard, J. M. Chovelon, N. Jaffrezic-Renault, *Langmuir,* 13, 2271 (1997)]. Therefore, to prepare very dense monolayers and to some extent shorten the time of the SAM deposition, the substrates are dipped in the silanisation solution cooled down to 5° C. for 60 minutes. Then, depending on the SAM treatment, the modified substrates are carefully washed in fresh toluene (HMDS-modified samples) or cyclohexane (OTS-modified samples), dried with pure nitrogen and baked on a hotplate at 100° C. for 20 minutes to complete the silanisation reaction.

Next, the desired organic semiconductor layer was produced e.g. regioregular poly(3-hexylthiophene)-2,5-diyl (P3HT, Aldrich) or regioregular poly(3,3'''-dialkyl-quaterthiophene) 3 (PQT) film [BENG S. ONG, YILIANG WU, AND PING LIU, PROCEEDINGS OF THE IEEE, VOL. 93, NO. 8, AUGUST 2005]. For P3HT, a 10 g/L solution in 1,2,4-trichlorobenzene was spin-coated (TCB, Anhydrous Grade, Aldrich) at 2000 rpm for 120 sec in air. It has been found that if the polymer is processed from TCB, photolithography and lift-off/etching of the material do not affect the electrical properties of the active layer, and so the semiconductor may be successfully patterned without any damage. Finally, the P3HT layer is annealed in a slightly over-pressured $N_2$ for 1 h at 100 C.

Once the appropriate layer (for carrying the mobile charge carriers) has been formed, photolithography (i.e. the second step) is then used to define regions of the order of microns/tens of microns. Conventional photolithography could be used, but for increased device performance and to avoid damage to the organic semiconductor during the processes, two novel methods of photolithography have been used by the present inventor. One method is referred to herein as a "lift-off" technique, the other the "subtractive" technique. Either method may be used as the second, photolithography step.

Firstly the "liftoff" technique will be described in detail, and then subsequently the "subtraction" technique. It will be appreciated that such photolithographic techniques can be used not only in the formation of planar devices as described above, but can also be used to form normal OTFTs. To illustrate the wider applicability of the techniques, both the lift-off and the subtraction techniques will be described with reference to forming OTFTs.

For practical applications, it is essential to tailor transistor channels and reduce gate dimensions to increase the much needed speed of OTFTs (currently only around or below kHz), isolate individual devices to avoid cross-talk, and improve on/off ratios: see S. Holdcroft, Adv. Mater. {13}, 1753 (2001); I. Kymissis, C. D. Dimitrakopoulos, and S Purushothaman, J. Vac. Sci. Technol. B {20}, 956 (2002). To meet these requirements, several approaches to pattern organic materials have been developed including screen printing, ink-jet printing, soft lithographic stamping, and photochemical cross-linking: see Z. Bao, Y. Feng, A. Dodabalapur, V. R. Raju, and A. J. Lovinger, Chem. Mater. {9}, 1299 (1997); S. C. Chang, Y. Bharathan, Y. Yang, R. Helgeson, F. Wudl, M. B. Ramey, and J. R. Reynolds, Appl. Phys. Lett., 2561 (1998); T. R. Hebner, C. C. Wu, D. Marcy, M. H. Lu, and J. C. Sturm, Appl. Phys. Lett., 519 (1998); J. A. Rogers, Z. Bao, A. Makhijia, and P. Braun, Adv. Mater. {11}, 741 (1999); F. J. Touwslager, N. P. Willard, and D. M. de Leeuw, Appl. Phys. Lett., 4556 (2002).

Despite these methods, conducting polymers in OTFTs reported to date are often not patterned, largely because of the lack of non-standard equipment and methods available. Even though jet printing is one of the most promising choices for future organic electronics, achievable feature dimensions are limited by the size of droplets which is typically around tens of micron: see J. R. Sheats, J. Mater. Res. {19}, 1974 (2004).

UV photolithography is a well established CMOS technology and has been used to manufacture billions of transistors operating at clock speeds in the GHz range on a modern silicon chip. To date, little has been reported to take advantage of this high-throughput technology in patterning conjugated polymers such as the well studied poly(3-hexylthiophene) (P3HT): see A. Tsumura, H. Koezuka, and T. Ando, Appl. Phys. Lett., 1210 (1986); H. Sirringhaus, N. Tessler, and R. H. Friend, Science, 1741 (1998); it was considered either incompatible or quite difficult: see Z. L. Li, S. C. Yang, H. F. Meng, Y. S. Chen, Y. Z. Yang, C. H. Liu, S. F. Horng, C. S. Hsu, L. C. Chan, J. P. Hu, and R. H. Lee, Appl. Phys. Lett., 3558 (2004). Due to the weak bonds in conjugated polymers, UV light exposure could seriously degrade the electronic properties of the materials: see J. Ficker, H. von Seggern, H. Rost, W. Fix, W. Clemens, and I. McCulloch, Appl. Phys. Lett. {85}, 1377 (2004). Chemical reactions between conducting polymers and the solvents and other chemicals used in photolithography might also arise: see M. Halik, H. Klauk, U. Zschieschang, T. Kriem, G. Schmid, and W. Radlik, Appl. Phys. Lett. {81}, 289 (2002). Recently, Austin and Chou developed an indirect way to pattern a P3HT film. A layer of $SiO_2$ was evaporated directly on the P3HT film and photolithography was carried out to pattern the $SiO_2$ to form an etch mask. The pattern transfer was finished by a $CHF_3$ reactive etching to remove $SiO_2$ and P3HT in the desired areas: see M. D. Austin and S. Y. Chou, Appl. Phys. Lett. {81}, 4431 (2002).

The novel technique described below provides a direct method to pattern P3HT film, and other conductive polymer films by photolithography. The method of patterning organic films comprises the steps: (a) providing a substrate (e.g. an insulative substrate) and forming on the substrate a layer of photoresist material; (b) forming a desired pattern in the photoresist material by a process of photolithography, (c) forming a layer of organic material on the patterned photoresist material; (d) performing a lift off process to selectively remove the organic material so that the organic material conforms to the patterning of the photoresist material. Typically, the organic material acts as a substrate, carrying mobile charge carriers such as holes or electrons.

The integrity of the patterned organic material is maintained after lift-off in order that the electrical properties of the material are unaffected.

There are two main types of organic materials that are semi-conducting-small molecules, which are conductive in their pure state but typically insoluble and therefore are vacuum deposited. One such material commonly used is Pentacene.

The second type—polymer—consists of long chains of carbon atoms. These are very poor conductors in their natural state, so a 'doping' agent is added, such as chlorine or iodine which vastly improves their conductivity. They are easier to handle than small molecule organics, due to their greater solubility in common organic solvents, meaning that they can be printed using inkjet or other conventional printing methods, enabling low cost, relatively easy, high volume manufacturing of electronics. Most work is being done on solution-processed materials. A common material used is P3HT.

In a preferred form of the method, feature sizes down to 1 µm were realized with high yield, and P3HT-based OTFTs were fabricated. Since photolithography is also widely available, such a method can provide pre-defined and well-controlled structures for material and device research. In the present novel method, conducting polymer is applied after processing of the photoresist by spin-coating, UV exposure, and development of the photoresist. Compared to an etching method, UV exposure to the conducting polymer is completely avoided and the time for the conducting polymer to react with oxygen and moisture in ambient air is shortened, which is important for most types of conjugated polymers: see G. Wang, J. Swensen, D. Moses, and A. J. Heeger, J. Appl. Phys. {93}, 6137 (2003); G. Wang, D. Moses, A. J. Heeger, H. M. Zhang, M. Narasimhan, and R. B. Demaray, J. Appl. Phys. {95}, 316 (2004). S. Hoshino, M. Yoshida, S. Uemura, T. Kodzasa, N. Takada, T. Kamata, and K. Yase, J. Appl. Phys. {95}, 5088 (2004). C. Vaterlein, B. Ziegler, W. Gebauer, H. Neureiter. M. Stoldt, M. S. Weaver, P. Bauerle, M. Sokolowski, D. D. C. Bradley, and E. Umbach, Synth. Met. {76}, 133 (1996). G. Horowitz, F. Deloffre, F. Garnier, R. Hajlaoui. M. Hmyene, and A. Yassar, Synth. Met. {54}, 435 (1993). M. S. A. Abdou, F. P. Orfino, Y. Son, and S. Holdcroft, J. Am. Chem. Soc. {119}, 4518 (1997). D. M. Taylor, H. L. Gomes, A. E. Underhill, S. Edge, and P. I. Clemenson, J. Phys. D {24}, 2032 (1991) This approach can also be applied to pattern small molecules, such as soluble pentacene: see J. E. Anthony, D. L. Eaton, S. R. Parkin, Org. Lett. {4}, 15 (2002).

A more detailed description of the "lift-off" method will now be provided.

P3HT-based OTFTs were fabricated using the following steps. Standard photolithography was performed to make Ti—Au source and drain ohmic contacts and then Ti—Au bond pads on a 200-nm-thick $SiO_2$ layer which was thermally grown on a n$^+$ silicon substrate. Photoresist was then spin-coated and patterned using photolithography, followed by spin coating or drop casting of P3HT. Finally, the liftoff of P3HT was performed by immersing the sample in a photoresist solvent, causing the semiconducting polymer on top of the patterned photoresist to be lifted off, resulting in a desired P3HT pattern.

Although these processing steps resemble those used to pattern thin metal films, such as the Ti—Au ohmic contacts and bond pads, a number of changes have to be made in order to pattern P3HT films. This is due to the very different physical and chemical properties of conducting polymers.

First, the most common solvent of P3HT, chloroform, was found to react rapidly with the standard positive photoresist Shipley S1813. After spin coating or drop casting P3HT on S1813, the reaction caused the surface of the P3HT film to be visibly rough and also distorted the edges of the photoresist pattern, as shown in FIG. 11(a). The desirable undercut profile of S1813, created by chlorobenzene curing, was also destroyed, causing the subsequent liftoff to be unsatisfactory. Experiments also showed that the edges of the resulted P3HT patterns were badly defined, even if the liftoff process was carried out immediately after the P3HT film had been dried.

To solve the problem, a different solvent, xylene, was used, which showed no visible reaction with S1813. The edges of the obtained P3HT patterns were very well defined, as shown by the optical microscope image in FIG. 11(b).

The success of the patterning method also strongly depends on how the liftoff process is carried out. It is different from fabricating ohmic contacts or bond pads, in which a metal film is evaporated or sputtered onto the pre-patterned photoresist from the normal direction. If the edges of the patterned photoresist have an undercut profile, the metal film will discontinue at the photoresist edges (unless the metal film is too thick), which results in successful liftoff in a photoresist solvent and formation of a metal pattern. This is also the case for vacuum-evaporated organic materials: see P. F. Tian, P. E. Burrows, and S. R. Forrest, Appl. Phys. Lett. {71}, 3197 (1997).

For a spin-coated or drop-cast polymer such as P3HT, however, the film is generally continuous across the edges of the pre-defined photoresist pattern. This, on the one hand, requires a certain force, which might be provided when the patterned photoresist is dissolved beneath the polymer film, to break the polymer film at the photoresist edges. On the other hand, the force has to be within some limit because a polymer film is often very thin, typically only tens of nm, causing the liftoff process to be more delicate than conventional liftoff of metal films.

Acetone is a common solvent used in liftoff processes to strip positive photoresists. If pure acetone was used, however, we observed that it often led to the liftoff of the whole P3HT film. Acetone was therefore diluted at different ratios to reduce the strength of the liftoff. The best results were achieved when one part of acetone was diluted with four parts of methanol.

FIG. 12(a) is an optical microscope image of an array of 1-µm-wide gate patterns, which are the smallest features that the inventor attempted to create with this method. The well-defined pattern is better viewed in the zoomed image in FIG. 12(b). Apart from P3HT films, successful photolithography was also performed using other soluble conducting polymer materials, such as poly(3,4-ethylenedioxythiophene)/poly (styrenesulfonate) (PEDOT/PSS).

With pre-patterned ohmic contacts and bond pads, OTFTs of different dimensions were fabricated. The n$^+$ silicon substrate acted as a back gate. Regioregular P3HT (more than 98.5% head to tail coupling) was obtained from Aldrich and used without further purification. A P3HT solution of 0.8% weight in xylene was filtered through a 0.2 µm PTFE syringe filter, to remove insoluble particles and impurities. Before coating P3HT, a layer of hexamethyldisilasane (HMDS) was deposited by spin coating to improve the interface between the $SiO_2$ surface and P3HT: see A. Salleo, M. L. Chabinyc, M. S. Yang, and R. A. Street, Appl. Phys. Lett. {81}, 4383 (2002) Atomic force micrographs have been taken of the surfaces of P3HT pattern after the liftoff, and the morphology was found similar to that reported: see T. A. Skotheim, R. L. Elsenbaumer, and J. R. Reynolds, Handbook of Conducting Polymers, Second ed. (Marcek Dekker, Inc, New York, 1998), p. 245. Furthermore, acetone did not seem to cause obvious decrease in the mobility of P3HT. Actually, we expect that the technology should also allow acetone-sensitive polymers to be patterned by encapsulation and then liftoff of both the polymer and encapsulation layers simultaneously.

FIG. 13(a) shows optical microscope images of two of the patterned P3HT transistors. The rectangular P3HT pattern covers the source and drain ohmic contacts, which are connected to the big bond pads. Yields well above 90% were achieved. FIG. 13(b) shows a typical source-drain current, $I_{SD}$, versus source drain voltage, $V_{SD}$, characteristic of an OTFT with a 9 μm-long and 40 μm-wide P3HT channel. Since the lithography processes were carried out in ambient air, the semiconducting polymer was slightly doped by oxygen. The field effect mobility was around $5\times10^{-4}$ $cm^2/Vs$, which is in agreement with typical values reported previously when xylene rather than chloroform was used as the solvent of P3HT: see Z. Bao, A. Dodabalapur, and A. J. Lovinger, Appl. Phys. Lett. {69}, 4108 (1996). Experiments were also performed to heat up P3HT OTFTs to 140° C. in vacuum for about one hour to de-dope the semiconducting polymer, and on/off ratios over were achieved.

OTFTs often suffer from a large contact resistance at source and drain electrodes, which could be much larger than the organic channel resistance: see P. V. Necliudov, M. S. Shur, D. J. Gundlach, and T. N. Jackson, J. Appl. Phys. {88}, 6594 (2000). K. Seshadri and C. D. Frisbie, Appl. Phys. Lett., 993 (2001). H. Klauk, G. Schmid, W. Radlik, W. Weber, L. Zhou, C. D. Sheraw, J. A. Nichols, and T. N. Jackson, Solid State Electronics, 297 (2003). N. Yoneya, M. Noda, N. Hirai, K Nomoto, M. Wada, and J. Kasahara, Appl. Phys. Lett. {85}, 4663 (2004) In general, bottom-contact (BC) OTFTs are easier to apply to denser electrical circuits than top-contact (TC) OTFTs, but usually show a higher contact resistance. To examine whether the contacts between the P3HT film and metal pads were weakened by the force that broke the P3HT film at the edges of the photoresist pattern during the liftoff process, we fabricated BC OTFTs with different channel lengths simultaneously. The contact resistance was determined by plotting the total source-drain (S-D) resistance as a functional of the channel length shown in FIG. 14. The dots represent experimental data of OTFTs of channel lengths of 3, 6, 9, 12, 15, 18, 21 and 24 μm. The extrapolation of the linear fit (dashed) line passes the origin, indicating that the contact resistance of our devices is substantially smaller than the channel resistance, even for the 3 μm-long OTFTs.

In summary, a direct method to pattern P3HT has been demonstrated using standard high-throughput photolithography technique with high yield. The method can be applied generally to both small molecules and conducting polymer materials. This technique can be extended to using optical phase-shifting masks to manufacture structures down to ~100 nm dimensions, which may significantly increase the speed of plastic electronic devices and circuits into the MHz range which is crucial in practical applications.

The lift-off method provides a nondestructive method of using UV photolithography to fabricate micron-sized conducting polymer structures. By coating a polymer film on patterned photoresist and then performing liftoff, UV exposure to the conducting polymer film was prevented throughout the lithography processes. The method has been used to create features down to 1 μM with high yield. Such CMOS-compatible microfabrication can be applied generally to various organic films, and may allow the speed of organic electronics to be improved. As can be seen, using this liftoff technique, organic thin-film transistors (OTFTs) were successfully fabricated using poly(3-hexylthiophene) as the active material, and typical OTFT characteristics were obtained.

The second, alternative, photolithography technique (the "subtractive" method) will now be described in detail.

The subtractive method provides a non-destructive, high-throughput, and high-resolution lithographic patterning method to fabricate organic-semiconductor devices based on UV lithography with the standard equipment of well-established silicon technology. The method described here is applied to fabricate poly(3-hexylthiophene) (P3HT)-based organic thin-film transistors (OTFTs), and features down to 2 μm are produced with high yield. Several modifications in the process steps are necessary in order to spin-coat photoresist on P3HT films and to completely remove P3HT residues on the substrates that have been treated with a self-assembled monolayer. Compared with OTFTs whose P3HT channels are not patterned, the on/off ratio of the patterned devices is improved by over four orders of magnitude from about 70 to $10^6$, because of the dramatically reduced gate leakage current. The extracted carrier mobility is not only virtually unchanged after the lithography processes, but also as high as 0.027 $cm^2/Vs$, which is among the best reported results for P3HT-based OTFTs fabricated in ambient conditions.

One of the necessary steps in the development of OTFTs is the patterning of the active semiconducting material. This is required in order to reduce the leakage current, crosstalk between individual devices, unwanted parasitic capacitance, and to increase the much-needed operational speed (current devices mostly operate around or below KHz frequencies). The most common patterning techniques developed so far include screen printing, ink-jet printing, lithographic stamping, photochemical crosslinking, and nanoimprint. Despite these methods, conducting polymers in OTFTs reported to date are often not patterned, largely because of the lack of non-standard equipment and methods. Even though ink-jet printing is one of the most promising choices for future organic electronics, it is a serial process and the achievable feature dimensions are limited by the size of the droplets, which is typically around tens of micrometers.

Ultraviolet (UV) photolithography is a well-established technology in the silicon electronics industry, and has been used to manufacture ~100-nm-sized structures with very high yield and throughput. It is desirable to extend the technology to plastic electronics because of the availability of the standard equipment and established lithography processes in industry and university laboratories. Even though UV lithography has been used to pattern small-molecule semiconductors (J. E. Anthony, D. L. Eaton, S. R. Parkin, Org. Lett. 4 (2002) 15), it was reported that some common chemicals used, such as acetone, could affect the carrier mobility. However, little has been reported about applications of UV lithography for patterning conjugated polymers such as the well-studied regioregular poly(3-hexylthiophene) (rr-P3HT).

Using the above-described "liftoff" method, P3HT structures as fine as 1 μm have been fabricated with high yield. However, P3HT solutions had to be made using an unusual solvent, xylene, rather than common solvents such as chloroform, 1,2,4-trichlorobenzene (TCB), etc, in order to avoid reactions between the solvent and photoresist. This led to a rather low hole-mobility in P3HT of about $5\times10^{-4}$ cm$^2$/Vs, as would be expected since the carrier mobility in P3HT is sensitively dependent on the choice of solvent.

The subtractive approach described here is a new method based on UV lithography. Since the photoresist is applied after the organic material (e.g. P3HT film) has been completely dried, any suitable (e.g. P3HT) solvent can be used. As a result, the extracted carrier mobility in the fabricated OTFTs reaches 0.027 cm$^2$/Vs, which is among the best in P3HT-based OTFTs fabricated in ambient conditions. Another important advantage of the subtractive process is the ability to pattern the organic film without the need to expose the substrate to any chemicals, which may be crucial if a self-assembled monolayer (SAM), e.g., hexamethyldisilazane (HMDS) or n-octadecyltrichlorosilane (OTS), is adopted to improve the OTFT performance.

The method also offers better-defined pattern edges, because the removal of unwanted P3HT areas is by etching (dissolving) rather than by mechanical tearing which typically results in edges bending upward with sharp features. A rough edge is not important for most organic devices but can become problematic for micron- or nano-sized structures. Patterns have been produced as small as 2 µm, with high yield. This subtraction photolithographic technique is described in conjunction with the fabrication of bottom-contact P3HT OTFTs, to show that the technique need not be limited to manufacturing planar devices. Using this subtractive technique, an improvement of over four orders of magnitude improvement was found in the on/off ratio and gate leakage current over the OTFTs whose P3HT channels are not patterned. The mobility in the saturated regime is found to be virtually unchanged before and after the P3HT patterning, confirming that no obvious degradation of the material quality has been induced during the processes. The experimental results also revealed that the poor on/off ratios of unpatterned P3HT-based OTFTs fabricated in air are mainly a result of the (vertical) gate leakage current rather than (in-plane) spurious current within the P3HT film.

Conventional bottom-contact OTFTs were fabricated in order to test the field-effect carrier mobility before and after patterning, and hence identify any degradation of P3HT during the lithography. Highly-doped silicon wafers with a thermally-grown SiO$_2$, 61 nm thick as determined by separate capacitance measurements, were used as the substrates. Gold source and drain electrodes, 50 nm thick, were evaporated and then defined by the standard photolithography and lift-off. A self-assembled monolayer, OTS, was employed in some of the substrates to improve the interface between SiO$_2$ and P3HT. The OTS deposition was carried out by immersing the substrates in 10$^{-3}$ M of OTS in cyclohexane at a temperature of 5° C. for an hour, followed by baking at 200° C. for 10 min in order to remove water molecules and to finish the OTS polymerization. Regioregular P3HT (more than 98.5% head-to-tail coupling) was obtained from Aldrich, and reduced by hydrazine. P3HT solutions of 1% weight in p-xylene or 1,2, 4-trichlorobenzene (TCB) were spun at 4000 rpm for 120 s on the substrates, which led to films about 20 nm thick on bare SiO$_2$ and about 50 nm on SiO$_2$ treated with OTS due to different surface hydrophobicities. The OTFTs were annealed at 100° C. for one hour in nitrogen gas flow in order to improve the degree of crystallinity of the P3HT films and hence also the carrier mobility (e.g. see A. Zen, J. Pflaum, S. Hirschmann, W. Zhuang, F. Jaiser, U. Asawapirom, J. P. Rabe, U. Scherf, and D. Neher, Adv. Funct. Mater. 14 (2004) 757). Since we found that the high boiling-point solvent TCB led to a higher carrier mobility, the results made from TCB-based P3HT solutions are presented here. Xylene-based P3HT solutions yielded to a lower carrier mobility but produced very similar results in terms of the pattern definition. Apart from SiO$_2$ substrates, some experiments were also performed on mica, which showed very similar pattern definitions.

The patterning processes mainly consist of spin coating photoresist on a P3HT film, development of the photoresist, and the removal of P3HT in the so-uncovered areas, as sketched in FIG. 15. The photoresist S1813 from the Microposit S1800 series, purchased from Shipley, was chosen, which is among the most commonly available photoresists and can be processed with well-established methods. However, since the photoresist was designed to coat hydrophilic surfaces, it was not possible to spin coat S1813 directly on the P3HT film, which has a highly hydrophobic surface. We therefore warmed up the S1813 in a sealed bottle on a hotplate at 90° C., and then immediately spun at 4000 rpm for 60 s on the P3HT film [FIG. 15(B)]. The increased temperature reduced the surface tension of the photoresist solution, which was evidenced by the clear improvement of the wettability and the much better coverage on the P3HT film surface. The obtained photoresist layer thickness was 1.5 µm, as measured with a Tallystep profilometer. In comparison, the photoresist thickness is about 1.3 µm if it is spun onto a normal SiO$_2$ substrate under the same spin-coating conditions, which reflected the difference in the surface hydrophobicity.

After spin-coating photoresist the sample was soft-baked on a hotplate at 40° C. for 10 min. It was found that a baking temperature higher than 90° C. normally led to the cracking of the P3HT film, when it was covered by the S1813, which could be due to a difference in the thermal expansion and/or possible relaxation of an incompletely-dried P3HT film when the remaining P3HT solvent continued to evaporate off the film. The photoresist was then exposed to UV light through a mask [FIG. 15(C)], followed by the development in a 1:1 solution of Microposit developer, also purchased by Shipley, and deionised water [FIG. 15(D)]. The P3HT in the areas that were covered by the mask during the UV exposure was not damaged by the UV light.

Although it has been reported that UV radiation at high doses could crosslink P3HT molecules and make the film insoluble (T. K. S. Wong, S. Gao, X. Hu, H. Liu, Y. C. Chan, Y. L. Lam, Mat. Sci. Eng. B 55 (1998) 71), it was found that P3HT in the areas that were exposed could still be removed unless an OTS surface treatment had been carried out on the substrate. This suggests that the typical exposure (about 150 mJ/cm$^2$) was not enough to cause serious cross-linking. Furthermore, the photoresist on top of the P3HT film might have absorbed much of the UV light. The P3HT film in the areas that photoresist was removed during the development was then etched (dissolved) in xylene for 5 s [FIG. 15(Ea)], followed by a rinse in acetone, which stopped the xylene etching and stripped off the photoresist [FIG. 15(F)]. The sample was then rinsed in methanol and blow-dried with anhydrous nitrogen, leaving only the patterned P3HT structures on the substrate.

Xylene was chosen as the etching solvent because of its high boiling point. The low evaporation rate assured that not much P3HT residual was formed. We also investigated other high-boiling-point solvents, namely TCB and chlorobenzene, but they typically led to a serious undercut of the P3HT film, most likely due to the swelling of the photoresist and the diffusion of the solvents between layers, which hampered the resolution of the proposed method. These high-boiling-point solvents, however, could be used to prepare P3HT solutions, even though they were not suitable in the etching process.

It was found that the P3HT film was not completely removed by xylene if the substrate had been functionalized with OTS. In this case the P3HT film in unwanted areas was removed by a quick oxygen-plasma ashing after the development of the photoresist [FIG. 15(Eb)]. The chamber pressure during the ashing process was kept at 60 mTorr with an oxygen flow of 50 sccm. The sample was ashed for 30 seconds at a power of 30 W. The photoresist was then stripped off with acetone and rinsed in methanol as in FIG. 15(F).

FIG. 16 shows the microphotographs of grid-like patterns that were transferred to a P3HT film. The sizes of the holes (brighter areas) are 10 μm, 5 μm, and 2 μm in FIGS. 2(B), 2(C), and 2(D), respectively. The 2 μm grid shows dots instead of squares, which was due to the limit of the lithography equipment rather than a problem during the process, since it can also be seen in the patterned photoresist S1813 in FIG. 16(A). The difference in the contrast between the patterned P3HT and patterned S1813 was due to the large difference in the film thicknesses: about 50 nm for P3HT and 1.5 μm for the photoresist.

One of the test devices, consisting of a 10 μm-wide Hall-bar structure fabricated on a mica substrate, is shown in FIG. 17. The Au ohmic contacts in FIG. 17(A) were defined by conventionally photolithography followed by lift-off, and a 20 nm-thick P3HT active layer was patterned using the above lithographic method. FIG. 17(B) is an atomic-force microscope (AFM) image of the P3HT bar, which shows that the obtained P3HT structure had smooth edges. This is in contrast to P3HT structures produced by the lift-off (additive) lithographic method (as described above, and in Nondestructive Photolithography of Conducting Polymer Structures, J. Chan, X. Q. Huang, and A. M. Song, Journal of Applied Physics, Vol. 99, 023710 (2006)) which typically results in edges bending upward with sharp features because the removal of unwanted P3HT areas is by mechanical tearing rather than by etching (dissolving).

FIG. 18 shows the sketches (A, C) and the transfer characteristics (B, D) of two OTFTs, one without and the other with the P3HT patterning. The large size of the device made it difficult to take a photo of the complete OTFT with an optical microscope. As can be seen from the layouts, after patterning, the OTFT channel width was slightly reduced from 2.3 mm (A) to 2.0 mm (C), in order to simplify the mask alignment. The channel length was 75 μm in both OTFTs, as defined by the distance between the two ohmic contacts. Photos of the devices could not be taken since the OTFTs were much bigger than the largest optical field of our microscope. Without patterning the P3HT film, the on/off ratio of the device was only about 70 as shown in the transfer characteristic in FIG. 18(B). The output characteristic of the device is plotted in FIG. 19(A), which was clearly dominated by the gate leakage current. The leakage current was in the order of μA within the ranges of the negative gate and source-drain voltages in the experiments. This means that the low on/off ratio in FIG. 18(B) was mainly due to the gate leakage current, which is understandable because it was integrated over the entire P3HT film area on the substrate. The large leakage current also means that the threshold voltage of the unpatterned OTFT was not necessarily around −7 V.

The OTFT transfer characteristic after patterning is plotted in FIG. 18(D). The on/off ratio was dramatically improved from 70 to about $10^6$ due to the reduction of the P3HT film coverage, which was confined only between the source and drain electrodes. The drain voltage was −25 V in the both measurements, in order to ensure the saturation of the OTFTs. The dotted lines are the linear fittings of the square root of the drain current as functions of the drain voltages, used to extract the carrier mobility.

The output characteristics of the OTFTs with and without patterning are shown in respectively FIGS. 19(A) and (B). In FIG. 19(A), the gate leakage current could be even larger than 80 μA at zero $V_D$ for negative gate voltages. The measurements were carried out in ambient conditions and in dark at room temperature. The unpatterned device showed a very strong gate leakage much higher than the saturated drain current at low drain voltages The dramatic reduction in the gate leakage current in the OTFT with a patterned P3HT channel, which largely determines the off current and consequently also the on/off ratio, is hence evident.

Previously, unpatterned P3HT-based OTFTs that were fabricated and measured in air generally showed poor performance, similar to that in FIG. 18(B). Doping in ambient environments was often regarded as a key reason. However, experimental results suggest that the main cause could actually be the high gate-leakage current if the device was not patterned. By using proper photolithography to define the P3HT channel, we show that high-performance OTFTs can be fabricated and measured in ambient conditions.

To extract the hole mobility, $\mu_h$, standard OTFT transport theory was used with the relation between the drain current, $I_D$, and the gate voltage, $V_G$, given by:

$$I_D = \frac{1}{2}\mu_h C' \frac{W}{L}(V_G - V_{TH})^2,$$

where $V_{TH}$ is the threshold gate voltage, C' is the capacitance per unit area of the gate dielectric, and W and L are the width and length of the transistor channel, respectively. The mobility, determined by a linear fitting of the square root of the drain current versus the gate voltage curve, was virtually the same in the unpatterned OTFT (0.025 cm$^2$/Vs) and in the patterned device (0.027 cm$^2$/Vs). This demonstrates that no obvious degradation in the electrical properties of the P3HT film occurred during the entire process. The use of acetone and methanol thus does not seem to affect the carrier mobility of the conducting polymer P3HT based on TCB and OTS, which is different from the reported influence on small-molecule semiconductors such as pentacene (J. E. Anthony, D. L. Eaton, S. R. Parkin, Org. Lett. 4 (2002) 15). The slight increase in the mobility in the patterned device could well be due to a small amount of doping in air, and the resulted additional carriers could screen and/or neutralize some of the charge traps in the P3HT film (X. Jiang, Y. Harima, K Yamashita, Y. Tada, J. Ohshita, A. Kunai, Chem. Phys. Lett. 364 (2002) 616).

This subtractive method provides a non-destructive method to pattern P3HT thin films based on UV lithography. The method has been successfully applied to the patterning of P3HT OTFTs, and can also be used to form planar devices such as SSDs and transistors. Electrical measurements showed a dramatic improvement in the on/off ratio, by over four orders of magnitude, from about 70 to $10^6$. The extracted mobility in the saturation regime was virtually unchanged at about 0.027 cm$^2$/Vs, which is among the highest hole mobilities in P3HT-based OTFTs that were fabricated in ambient conditions. The gate leakage current, rather than the spurious current within the P3HT film, resulted in the poor performance of unpatterned OTFTs.

Once the appropriately sized regions have been formed using the second (photolithography) step, nanolithography (the third step in the device production method) was used to form the final devices e.g. planar devices such as SSDs or transistors. The nanolithography step used will now be described.

Samples were transferred to an atomic force microscope (AFM). A VEECO CP-R Research AFM was used in the experiments. $Si_3N_4$ tips were adopted for both imaging using the tapping mode and nano-indentation (i.e. trench creation). The tips have radii of about 20 nm, with angles about 30 degree and typical force constants of 14 N/m. Different types of tips, such as ultra-sharp STING probes with radii of less than 5 nm have also been used, but no obvious difference in the width of the created trenches was found. Typical tip displacements (the nominal distance the tip pushes/moves into the film/layer of organic semiconductor) were between 0.1 μm to 0.5 μm. The cutting speed of the tip was normally between 1 to 100 μm/s. The trenches were generally shown to have a flat bottom. The trenches obtained were normally much wider than the AFM tip diameter, presumably because of the strain in the film.

Initially, a quick image of the channel in non-contact mode was taken, prior to formation of the trenches. Next, using the standard nanolithography software supplied with the equipment and user-predefined shapes, an array of SSDs or planar transistors was created, i.e. the AFM tip cut the semiconductor, forming the insulating trenches that defines the channel and the different areas of the device. The devices are transferred to a test station and characterized electronically e.g. recording I(V) and frequency responses.

FIG. 20A shows a current-voltage (transfer) characteristic curve of a nanotransistor created using the above method, and FIG. 20B shows an AFM image of the nanotransistor. The nanotransistor was formed using a PH3T solution in xylene, on a mica insulative substrate. The transistor has a channel length of 1 μm and a channel width of 250 nm. The trenches were about 250 nm wide.

The large gate voltage range is due to the use of heavily doped P3HT. Using less doped material and/or narrower trenches would allow much lower gate voltage range. This transfer characteristic curve of the organic planar nanotransistor shows a good on/off ratio, about 1000. It shows that the transistor can work in both enhancement mode (negative gate voltage, current increase) and depletion mode.

The invention claimed is:

1. An electronic device comprising a supporting mobile charge carriers, insulative features formed on the substrate surface to define first and second substrate areas on either side of the insulative features, the first and second substrate areas being connected by an elongate channel defined by the insulative features, the channel providing a charge carrier flow path in the substrate from the first area to the second area, the conductivity between the first and second substrate areas being dependent upon the potential difference between the areas, wherein the mobile charge carriers have a mobility within the range 0.01 $cm^2/Vs$ to 100 $cm^2/Vs$ and wherein said substrate is formed as a thin film, disposed on an insulative substrate comprising flexible paper.

2. A device as claimed in claim 1, where the mobile charge carriers have a mobility within the range of 0.1 $cm^2/Vs$ to 100 $cm^2/Vs$.

3. A device according to claim 1, wherein said elongate channel is of a width such that when a voltage difference is applied between said first and second substrate areas such as to cause flow of said mobile charge carriers through said elongate channel, the voltage existing in the second substrate area influences, via said insulative features, the size of depletion regions existing within said elongate channel, whereby the conductivity characteristics of the channel are dependent on said voltage difference.

4. A device according to claim 1, wherein the device comprises a diode for rectifying an RF signal, between 0.5 MHz and 1 GHz.

5. A device as claimed in claim 1, wherein said mobile charge carriers are electrons.

6. A device as claimed in claim 1, wherein said mobile charge carriers are holes.

7. A device as claimed in claim 1, wherein said substrate is greater than 20 nm thick.

8. A device as claimed in claim 1, wherein the device functions as a diode.

9. A device as claimed in claim 1, wherein said device is a planar device, with said substrate being positioned within a single layer.

10. A device as claimed in claim 9, wherein said single layer is not sandwiched between two additional layers of other material within a laminate structure.

11. A device as claimed in claim 9, wherein said single layer defines an outer surface of the device.

12. A device as claimed in claim 1, wherein said substrate comprises at least one of: semi-conducting polymer; poly(3-hexyl)thiophene (P3HT); organic small molecules; pentacene; solution processed semiconductor nanoparticle/quantum dot materials; and said insulative substrate comprises at least one of flexible paper; polyethylene terephthalate (PET); and polyethylene naphthalate (PEN) material.

13. A device as claimed in claim 1, further comprising a respective electrical terminal located on each of said areas for application of a voltage thereto.

14. An electronic circuit comprising at least one electronic device as claimed in claim 1.

15. An electronic circuit as claimed in claim 14, comprising a plurality of said electronic devices arranged in parallel between said first and second substrate areas to provide a desired impedance.

16. An electronic circuit as claimed in claim 14, comprising an RFID tag.

* * * * *